United States Patent [19]
Hoenninger, III et al.

[11] Patent Number: 5,529,068
[45] Date of Patent: Jun. 25, 1996

[54] SYNCHRONIZED DIGITAL SIGNAL PROCESSOR FOR MRI RECEPTION

[75] Inventors: John C. Hoenninger, III, Oakland; Lawrence E. Crooks, Richmond; James W. Jones, Novato, all of Calif.

[73] Assignee: The Regents of the University of California, Oakland, Calif.

[21] Appl. No.: 260,789

[22] Filed: Jun. 16, 1994

[51] Int. Cl.$^6$ .................................................. A61B 5/055
[52] U.S. Cl. ........................................ 128/653.2; 324/309
[58] Field of Search .............................. 128/653.2, 653.5; 324/307, 309, 318, 322

[56] References Cited

U.S. PATENT DOCUMENTS

| | | | |
|---|---|---|---|
| Re. 33,259 | 7/1990 | Crooks et al. | 324/309 |
| 3,423,529 | 1/1969 | O'Neill. | |
| 3,443,229 | 5/1969 | Becker. | |
| 3,552,537 | 8/1970 | Boughtwood. | |
| 4,594,607 | 6/1986 | Lewis, Jr. et al. | |
| 4,673,880 | 6/1987 | Compton et al. | 324/309 |
| 4,709,270 | 11/1987 | Mehrgardt. | |
| 4,740,753 | 4/1988 | Glover et al. | |
| 4,785,463 | 11/1988 | Janc et al. | |
| 4,839,573 | 6/1989 | Wise. | |
| 4,879,514 | 11/1989 | Mehlkopf et al. | 324/309 |
| 4,893,316 | 1/1990 | Janc et al. | |
| 4,949,040 | 8/1990 | Proksa. | |
| 4,958,311 | 9/1990 | Kadowaki et al. | |
| 4,992,736 | 2/1991 | Stormont et al. | |
| 5,170,122 | 12/1992 | Bernstein. | |
| 5,170,123 | 12/1992 | Holland et al. | |
| 5,349,296 | 9/1994 | Cikotte et al. | 324/309 |

OTHER PUBLICATIONS

Harris Corporation Data Sheet, "HSP43220, Decimating Digital Filter," File 2486.2, pp. 3–3 to 3–22, May 1991.
Crochiere & Rabiner, *Multirate Digital Signal Processing*, 1–42, 193–218 (Prentice–Hall 1983).
Crooks et al, *Noise Aliasing at the Input of Analog–to–Digital Converters in MR Systems*, Abstract SMRI 11th Annual Meeting (Mar. 27–31, 1993, San Francisco).
Crooks et al, *Performance of a Digital Receiver with a Floating Point Digital Signal Processor*, Abstract, SMRI 11th Annual Meeting (Mar. 27–31, 1993, San Francisco).
Crooks, Arakawa & Hoenninger, *Performance of Some Analog–to–Digital Converters used in MR Systems*, Abstract, SMRI 11th Annual Meeting (Mar. 27–31, 1993, San Francisco).
Crooks, Hoenninger & Arakawa, *Performance of Analog-–to–Digital Converters and a Floating Point Digital Signal Processor in a Digital Receiver for MRI*, Poster, IEEE Nuclear Science Symposium (Nov. 3–6, 1993, San Francisco).
Holland, *An Overview of Digital Spectrometers for MR Imaging*, 2 Journal of Magnetic Resonance Imaging, 241–246, (Mar./Apr. 1992).
Holland et al, *The Design of a Digital RF Transmitter/ Receiver (DTR) for Magnetic Resonance Imaging*, 1–8 (Picker International Inc. 1990).

(List continued on next page.)

Primary Examiner—Krista M. Zele
Attorney, Agent, or Firm—Nixon & Vanderhye

[57] ABSTRACT

A multi-rate sample MRI (magnetic resonance imaging) digital receiver maintains synchronization of digitally processed signals. This multi-rate sample data system is used to demodulate and filter a digitized MRI RF signal. A phase/ timing relationship is established between the signal received and processed by the digital receiver, and the physical nuclear magnetic resonance (NMR) process the body being imaged is undergoing. Once established, the phase/timing relationship is maintained for the duration of the particular NMR experiment being performed. Special logic in the digital system ensures that the data output is synchronized with an external synchronous signal controlling data acquisition within the MRI system. Optimum signal processing is performed to minimize the time between the end of the acquisition control signal and the last output from the digital signal processing system.

22 Claims, 21 Drawing Sheets x[0] is synchronized with RCVR GATE
x[sync] is synchronized with SAMPLE GATE

OTHER PUBLICATIONS

Holland et al, *The Design and Comparative Evaluation of a Digital Transmitter/Receiver (DTR) for MR Imaging*, Proceedings of the 1989 SMRM, at 182.

Holland et al, *Simultaneous Imaging with Multiple Coils Using Digital Transmit and Receive Circuits*, Proceedings of the 1989 SMRM, at 1143.

Proska, *A Fully Digital Spectrometer for Low Field MR Imaging Systems*, Proceedings of the 1988 SMRM, at 266.

Rader, *A Simple Method for Sampling In–Phase and Quadrature Components*, IEEE Transactions on Aerospace and Electronic Systems, vol. AES–20, No. 6, pp. 821–824 (Nov., 1984).

Harris Corporation data sheet, "HSP43216, Halfband Filter," File No. 3365.1, Aug. 1993.

Redfield, et al., *Simple NMR Input System using a Digital Signal Processor*, Journal of Magnetic Resonance, Series A 108, 234–237 (1994).

Halamek et al., *The Elimination of Baseline Distortions Induced by Audio Filters*, Journal of Magnetic Resonance, Series A 110, 194–197 (1994).

M. E. Rosen, *Selective Detection in NMR by Time–Domain Digital Filtering*, Journal of Magnetic Resonance, Series A 107, 119–125 (1994).

SYNCHRONIZED DIGITAL SIGNAL PROCESSOR FOR MRI RECEPTION

CROSS-REFERENCE TO RELATED APPLICATIONS

This application is related to commonly-assigned patent application Ser. No. 08/503,045 filed Jul. 19, 1995 entitled "Method for Reducing Digital Filter Transients In MRI Systems" (attorney docket no. 89-191).

FIELD OF THE INVENTION

This invention relates to nuclear magnetic resonance (NMR) imaging, and more particularly to digital RF receiving techniques for use in magnetic resonance imaging (MRI) systems. Still more specifically, the present invention relates to arrangements for synchronizing a digital RF receiver with an MRI system; and to arrangements for minimizing the latency introduced by a digital RF receiver.

BACKGROUND AND SUMMARY OF THE INVENTION

Nuclear magnetic resonance ("NMR") phenomena cause the human body (or other object of interest) to generate radio signals ("NMR signals") for pick-up by a magnetic resonance imaging ("MRI") system. The magnetic resonance imaging ("MRI") system has a radio frequency (RF) receiver which receives, amplifies and filters these NMR signals. The RF receiver's output is processed by a computer to generate a displayed image of the body's internal structure.

To generate high quality images, it is important for the MRI RF receiver to accurately receive and process the weak NMR signals generated by the body. Unfortunately, various defects in RF receiver operation (e.g., internally generated noise, digital quantization errors, "aliasing" effects, quadrature channel imbalance) can introduce distortion and noise which degrade the "purity" of the received NMR signals—and thus decrease the quality of the resulting images.

Until very recently, analog receivers were used to receive the NMR signals in MRI imaging systems. One weakness in past analog receiver design relates to the anti-aliasing filters that must be used prior to digital sampling to prevent out-of-band signal components from being "folded over" into the desired signal band during the sampling process. These filters must provide tight frequency selectivity and other high performance, and therefore are expensive to design and implement while nevertheless suffering from certain performance deficiencies (e.g., frequency-dependent phase shifts, poor transient response, non-zero DC offset, drift, and imperfect gain and phase matching between pairs of filters used for "quadrature" channels).

So-called "digital receivers" have replaced analog receivers in other applications (e.g., radar and communications) requiring high-performance signal processing. As digital signal processors (DSPs) and other "fast" digital hardware have become available, cost-effective and increasingly more capable, it has become possible to filter the received NMR signal in the digital domain instead of the analog domain in order to increase receiver performance in certain respects. For example, it is possible to construct, using modern digital signal processing components, a digital filter which exhibits a linear phase response throughout its passband. Digital filtering provides additional significant advantages including, for example, programmability, potential increases in dynamic range, and potential improvement in S/N. Similarly, "digital receivers" implemented using modern digital signal processing components have several well known advantages such as elimination of DC and low frequency noise, perfect matching of I and Q (quadrature) channels, high performance filters and finer quantization. Digital signal processing techniques can thus significantly improve noise and distortion performance (and hence image quality), and can provide additional advantages such as increased stability and flexibility.

Despite the apparent applicability of digital receiving techniques to MRI systems, MRI imposes certain performance constraints that are not commonly found in other types of RF systems that use digital receiving techniques. For example, a typical digital RF communications receiver continuously processes a received input signal for a relatively long time (e.g., seconds, minutes, hours, or even longer). Commonly, the digital receiver "locks" onto the phase of the input signal to ensure that the receiver is continually synchronized with the phase of the signal. For example, a digital "phase locked loop" detector may be used to extract phase information from the incoming input signal. This phase lock is then used to synchronize the detector with the phase of the incoming signal and thereby ensure that the detector does not introduce phase errors into its output. Because the input signal is continuously available, the digital receiver's phase locked loop can unambiguously "follow" the phase of the input signal so long as the signal continues to be present.

In contrast, in a MRI system the input signal is only intermittently available to the RF receiver due to the excitation/acquisition cycling inherent in the NMR process. At least part of the RF receiver must be turned off during each RF pulse spin excitation in an MRI system in order to prevent the receiver from becoming desensitized (or even damaged) by the powerful RF transmit pulse. The receiver is turned on between RF pulses to receive the NMR signal "echo" emitted by the nuclei as they return to spin-lattice equilibrium. The NMR signal of interest consists of one or more energy "bursts" combined with noise. Since phase encoding techniques are often used to provide multidimensional imaging, many different NMR signals of different phases may be received at more or less the same time during a given acquisition cycle. The MRI receiver must accurately receive each entire NMR signal envelope without introducing any phase ambiguities into the received signal—even though sometimes there is only a relatively short time (e.g., much less than a millisecond) between when the RF transmitter has finished transmitting and the time when the receiver must receive the responsive envelope of NMR signals.

To make matters even more difficult, an MRI "experiment" used to collect dam for an image may consist of hundreds or thousands of such NMR excitation/acquisition cycles spanning a duration of tens of minutes. In view of the importance of NMR signal timing characteristics to the imaging process, it is critical that the receiver output remains "phase locked" for the entire duration of a complete experiment—a difficult objective to achieve considering that the signal to be received is only intermittently available, and that the receiver "front end" must be deactivated each time the RF transmitter is transmitting. The MRI receiver cannot change its phase shift from one acquisition cycle to another, since any such inconsistent phase shift would destroy the phase coherence of the acquired data set and degrade the spatial resolution and/or clarity of the resulting image or could introduce annoying artifacts into the image.

In addition, all time delays introduced by digital processes (e.g., digital receiver detection and filtering) must be completely predictable and compensated for so that there is no loss of signal timing information. Uncompensated delays introduced by the digital filtering process (or at any stage along the signal processing path) have the potential for introducing artifacts or decreasing the spatial resolution of the final image. Thus, the receiver must be carefully designed so that timing parameters associated with all of the data in the data set produced by an experiment are internally self-consistent, and fully synchronous with MRI sequencer control signals.

Because of the often rapid, repeated cycling between the "excitation" and the "acquisition" parts of the MRI imaging process, it is necessary for the digital MRI receiver to finish processing a previously received NMR signal before the next NMR signal arrives. All digital filtering and detection should be completed within about 1 msec (the minimum time between successive signal receptions in a modern MRI system) so that the receiver is ready to receive the next NMR signal envelope. In view of the computational complexity of the necessary digital filtering, it is difficult to provide a system that can complete all digital filtering and detection in this short time period. Typical digital signal processors (DSPs) are capable of performing only a single FIR (finite impulse response) filtering calculation per clock cycle. The number of filtering calculations involved in processing a signal through an FIR digital filter is related to the number of filter "taps" (analogizing to old-style "tapped" delay lines). Generally, more "taps" are required to provide higher performance with respect to certain filter parameters (e.g., bandwidth and/or sharpness of roll-off). Cascading two or more FIR digital filters in a "multi-rate" arrangement may decrease the overall number of computations and thus reduce the total number of "taps" through the FIR digital filtering process. However, even cascaded digital filters typically require several hundred "taps" to achieve the pass band and roll off characteristics necessary to adequately filter an NMR signal prior to digital re-sampling (decimation) or sampling rate reduction.

Some work has been done in the past to solve problems associated with using a digital receiver in an MRI system. As one example, it is known to operate the quadrature detector (demodulator) of an MRI digital receiver from the same constant stable time base used to generate the MRI transmitter carrier frequency in order to insure phase consistency of the received NMR signals in multiple imaging sequences. However, further improvements are possible.

In accordance with one aspect of the present invention, a multi-rate FIR filter MRI digital receiver accurately maintains synchronization between the ongoing NMR phenomena and signals digitally processed in real time—despite the intermittent availability of the NMR signal and despite intermittent operation of at least parts of the digital receiver used to receive and process the NMR signal. In accordance with this aspect of the present invention, a phase locked relationship is established between the signal received and processed by the digital receiver, and the physical NMR process the body being imaged is undergoing. Once established, the phase/timing relationship is maintained for the duration of the particular NMR experiment being performed. In addition, special logic in the digital signal processing system ensures that the digital receiver's data output is fully synchronized with an external synchronous signal controlling data acquisition within the MRI system. This is important in allowing images free of artifacts to be computed.

In accordance with the phase locked aspect of the present invention, the MRI digital receiver establishes the phase of the received NMR signal and processes it in a phase locked, time-coherent fashion. This phase locking in the preferred embodiment basically involves: (a) establishing a fixed, ascertainable timing relationship between periodic digital receiver input signal sampling times and the phase of a periodic transmitter carrier signal; and (b) digitally processing (e.g., filtering) the resulting sampled values in a manner that observes this fixed phase relationship in order to ensure that the digital process output is phase-consistent across all NMR signal acquisition cycles throughout an MRI experiment.

In order to observe the fixed phase relationship across all NMR signal acquisition cycles within an MRI experiment, the present invention provides a phase-maintaining mechanism (e.g., a sequential state machine such as a counter or other logic device capable of keeping track of periodic phase state changes) that is active throughout the MRI experiment. This phase-maintaining mechanism continuously keeps track of the RF carrier phase even during RF transmit times when the digital receiver is nominally "off". The phase-maintaining mechanism is used to synchronize further digital processing. For example, the phase-maintaining mechanism can impose phase synchronization on the quadrature detection process (and thus also on the subsequent digital filtering process) to ensure that these processes are performed in a phase-consistent manner from one acquisition cycle to the next throughout the entire MRI experiment.

In the preferred embodiment, analog-to-digital conversion sampling is performed continuously—even during RF pulse transmit times when the digital receiver is nominally "off". The analog-to-digital converter sampling timing is synchronized with a continuous reference time base used to generate the transmitter carrier frequency. This has the effect of establishing a predetermined fixed relationship between (a) the RF carrier phase/frequency, and (b) the digital sampling rate of the analog-to-digital converter. Because the sampling process is continuously synchronized with the phase of RF transmitter pulses used to generate NMR phenomena within the body being imaged, the sampling process is inherently synchronized also with those NMR phenomena—and with the resulting NMR signals emanated by the body and received by the digital receiver. This means that each of the digital data values output by the analog-to-digital converter results from sampling at a specific predetermined fixed—and ascertainable—timing relative to the phase of the NMR phenomena occurring within the body being imaged. Once "phase lock" has been established, a "receive window" is opened during each NMR signal acquisition cycle when the output of the digital receiver is valid.

To establish "phase lock", the preferred embodiment assigns the first output of the analog-to-digital converter as the phase "zero" reference, and then continues to digitize data during an entire MRI protocol ("experiment"). This means that the sampling process provides a stream of data points corresponding to a periodic, unbroken sequence of time instants during an entire MRI experiment—with those time instants being synchronized with particular phases of the RF carrier frequency. The digital receiver identifies the phase of the received signal at an arbitrary cycle as the "zero" phase reference. The phase points corresponding to the periodic samples repeat for each periodic cycle of the transmitter carrier frequency. Therefore, the preferred embodiment provides what in one implementation is essentially a counting function for correlating or indexing each successive sample relative to the arbitrary "zero" phase reference point of each RF carrier period. A "phase index" can then index each successive digital sample point relative to the arbitrary "zero" phase reference.

In the preferred embodiment, an integer ratio (e.g., 4 to 1) exists between the sampling frequency and the down-converted RF carrier frequency as it is provided at the output of the last intermediate frequency (IF) section of a superheterodyne conversion process. This means that there is a fixed ratio of four samples for each IF carrier cycle—and moreover (since the phase of the sampling process is locked to the phase of the carrier frequency) that the sample timing corresponds exactly to four different specific phase angles (e.g., 0°, 90°, 180° & 270°) defined relative to the period of the IF carrier frequency. The absolute sample times need not correspond to the absolute phase of the carrier signal—what is important is that the timing relationship between the sample times and carrier phase is fixed and predetermined for the duration of the MRI experiment.

The present invention provides several alternative techniques/structures for implementing a mechanism for keeping track of the carrier signal phase and maintaining relative synchronization between that phase and the digital processing in order to maintain "phase lock" throughout an MRI experiment. All of the alternative techniques allow a "phase index" to specify either explicitly or implicitly the phase relationship between the phase reference point and each successive digital sample in the input data stream.

In accordance with one alternative, the digital receiver quadrature demodulator is operated continuously during an entire MRI experiment. By continuing to process, even during times when the data is non-valid (e.g., during the excitation stage when the RF transmitter is activated), the digital receiver demodulator never loses synchronization and therefore does not have to be resynchronized upon reception of each new NMR signal. In accordance with one aspect of the preferred embodiment of the present invention, a separate digital signal processor is provided with a dedicated function of maintaining phase lock and demodulating the NMR signal. This DSP is always active during operation of the digital receiver, and therefore it never misses an input and thus maintains continuous synchronization. One or more further DSPs (which can be active only during times when the transmitter is not transmitting) may be provided to do the digital filtering analysis.

Another alternative technique for maintaining synchronization throughout an entire experiment is to provide a dedicated counter which continually counts the number of digital samples. If the analog-to-digital conversion frequency is locked to the RF carrier frequency, the counter can increment for each predetermined angular displacement of the received IF carrier signal (e.g., every 90°). The counter output may then be used to keep track of the signal phase. Since the analog-to-digital converter and associated phase-counting counter operate all the time throughout an MRI experiment, phase coherency is never lost. The rest of the digital receiver (e.g., the demodulator and the digital filter processes) can be turned on and off as needed throughout the experiment.

Another alternative technique is to synchronize the "receiver on" timing control signal with the phase of the analog-to-digital conversion clock. Using this technique, the MRI microcoded digital sequencer used to generate the "receiver on" timing control can be synchronized with the phase of the analog-to-digital conversion clock so that it always turns the receiver "on" at a consistent predetermined phase relative to the RF carrier. This ensures that the digital receiver will always process the digital samples in a phase-coherent manner from one acquisition cycle to the next. Such synchronization establishes relative phase lock within the measurement process by ensuring that the digital receiver always becomes active at a predetermined phase relative to the sampled outputs generated by the analog-to-digital converter. If this technique is employed, care must be taken to ensure that the "receiver on" control signal does not interfere with the dam input due to digital logic "race conditions."

Another aspect of the present invention is the data acquisition synchronization capability which is implemented in the multi-rate FIR digital filter. Synchronization is important for MRI due to the collection of a large number of data sets which must be precisely time related. Data is collected over the duration of the experiment but data sets will all be processed together using a 2D or 3D FFT after the MRI sequence is completed. With an analog filter, the group delay is well defined so that a signal appears at the output with a fixed delay after the input has occurred and the data timing with respect to the leading edge of the "SAMPLE GATE" signal (during which received data is valid) is maintained for every data acquisition time window throughout the MRI sequence. With digital filters, the group delay is also fixed but it is necessary to determine the exact data input coinciding with the SAMPLE GATE leading edge and to track it throughout the multi-stage FIR filtering process. Time synchronization of an FIR input to an external control signal and correlation to a specific output is not provided for in the standard convolution of a signal with an FIR filter, which normally assumes a continuous input signal. The present invention provides that the first output of the FIR multi-rate filter is precisely related in time to the specific input data point which occurred at the leading edge of the SAMPLE GATE signal generated by the MRI sequencer controller. The input data index in the buffer corresponding to the leading edge of SAMPLE GATE is saved as the "sync" index for the x[ ] (first FIR filter stage input) data buffer. Decimation of the first FIR stage data output y[ ] requires the calculation of the "sync1" index for the yd[ ] buffer of decimated data used as input to the second FIR filter stage. In the case of a two stage multi-rate FIR filter, the first decimated output of the second FIR filter stage zd[ ] is exactly time synchronous with the original x[sync] input data value. The efficient implementation of data acquisition synchronization in the multi-rate FIR filters is important and ensures MRI images free of artifacts.

In accordance with another aspect of the present invention, digital filtering is optimized to minimize the time ("latency") between the end of the SAMPLE GATE acquisition control signal and the time at which the last output from the digital signal processing system is ready. This technique provided by the present invention minimizes how much time a multi-stage FIR digital filtering system requires to process an NMR signal envelope. The standard approach for computing cascaded FIR filters is to perform the filtering convolution computations serially. After enough data points from the input stream are collected, the first FIR filter stage outputs are computed. Once enough outputs of the first filter stage are computed to allow a standard convolution, then successive outputs of the second filter stage are computed. In either case for a real time system, this means that there is a significant lag in the generation of filter outputs after the final data has been input to the multi-stage filter since each output requires a full standard convolution to be performed. In fact, it is not necessary to wait until all data points have been collected before FIR filter convolution computations can be performed. Once the "synchronization index" into the input data stream has been identified by the leading edge of SAMPLE GATE, it is possible to predict the set of indices which will contribute to each output of a FIR filter.

An "inverted convolution" is used in the preferred embodiment to determine which products involving a particular filter input are part of the sums forming any particular filter output. This makes it possible to compute the products of the summation for each filter stage output as the data becomes available to perform each computation. In other words, it becomes possible to compute an array of partial sums, one for each output, on an ongoing basis (with each newly available input being used to compute appropriate products that are added to the array of partial sums on a "rolling basis") such that some subset of the partial sums are approaching a final value over the duration of the data acquisition. Once the last input becomes available, the digital filter only has to calculate n products and n additional partial summations (where n is less than or equal to the number of filter "taps")—instead of n standard convolutions as would normally be required—before the final subset of filter outputs are computed completely. Note that in the preferred embodiment it is assumed that after the last data input and the de-assertion of SAMPLE GATE, all subsequent input data x[ ] are zero. There is thus minimal time lag between when the last valid input is applied to the digital receiver and when the digital receiver can finish computing and outputting its last valid digitally filtered data.

By minimizing the latency between the time the last filter input becomes available and the time the digital filter is able to output final, digitally filtered results, the digital receiver provided by the present invention finishes processing the NMR signal envelope quickly even though the digital receiver is applying very complex digital filtering to the incoming signal. Minimum time lag is important because the time between successive RF excitation/acquisition cycles for certain types of MRI sequences can be very short (e.g., on the order of 1 ms)—and the digital receiver must finish processing a previous NMR signal envelope before a next successive signal envelope arrives. The minimal digital filtering time provided by the present invention allows relatively complicated digital filtering using "long" or large order (i.e., large number of "taps") FIR digital filters to be used for excellent digital filtering characteristics. Out-of-band noise is substantially eliminated to improve image clarity while image flatness and field of view are maximized. Even though large order digital filters are used, the MRI system is ready to begin processing the next successive NMR signal envelope at least by the time the next NMR signal envelope begins to arrive.

BRIEF DESCRIPTION OF THE DRAWINGS

These and other features and advantages provided by the present invention will become better and more completely understood by studying the following detailed description of presently preferred exemplary embodiments in conjunction with the drawings, of which.

DETAILED DESCRIPTION OF PRESENTLY PREFERRED EXEMPLARY EMBODIMENTS

Figure 1:
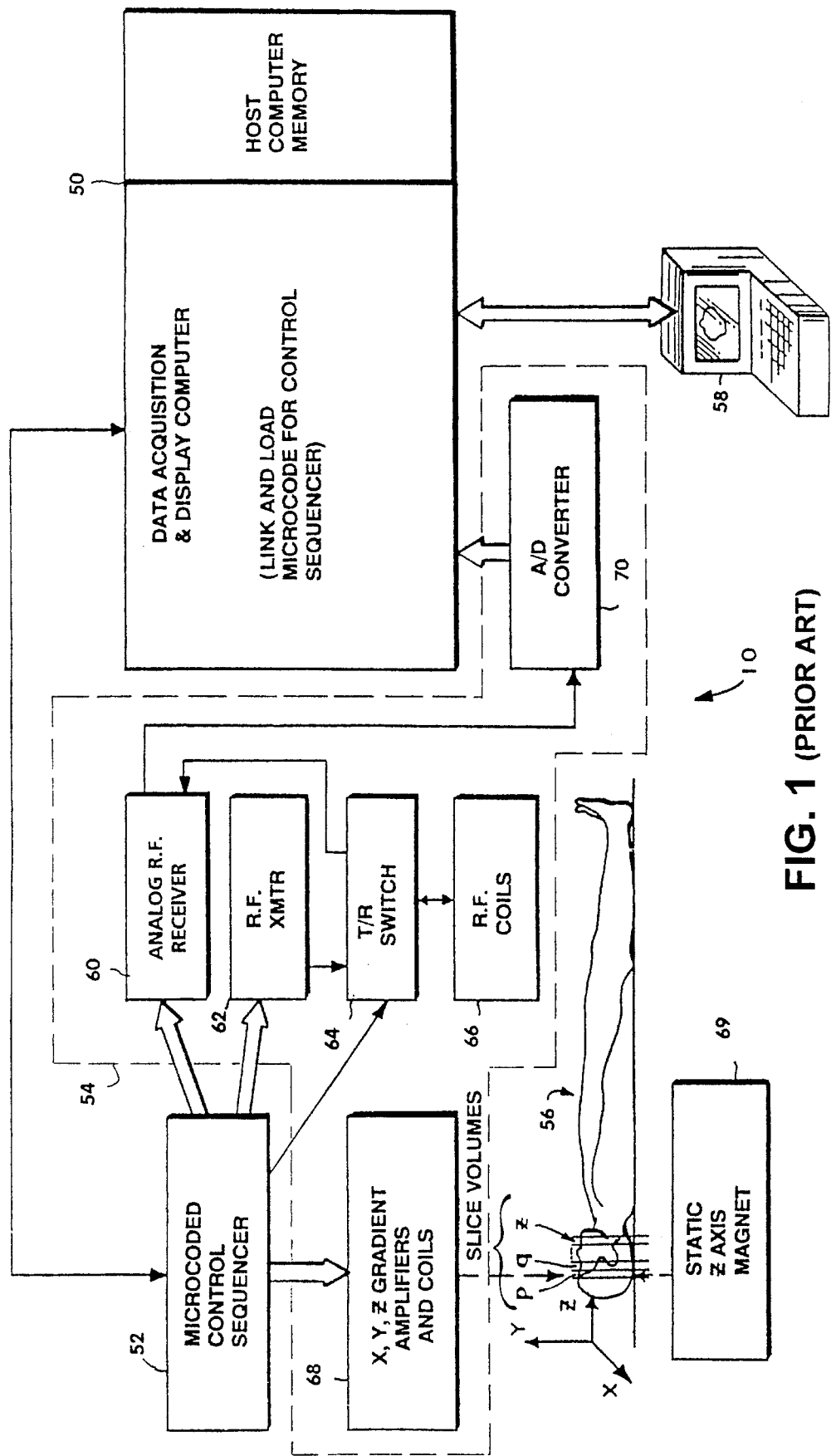
FIG. 1 is a block diagram of a prior art MRI system including an analog RF receiver and A/D converter.

Providing some background regarding the type of overall system the present invention operates within, FIG. 1 is a schematic block diagram of an exemplary prior art magnetic resonance imaging ("MRI") system 10. System 10 includes a computer 50, a sequencer 52, and an MRI subsystem 54. Subsystem 54 is controlled in real time by sequencer 52 to generate magnetic and radio frequency fields that stimulate nuclear magnetic resonance ("NMR") phenomena in an object 56 (e.g., a human body) to be imaged. A resulting image of body 56 on display 58 may show features and structures that cannot be seen using X-ray, ultrasound or other medical imaging techniques.

The basic techniques for magnetic resonance imaging are very well known and accordingly need not be explained here in detail. Very simply, MRI subsystem 54 includes a large static magnet 69 which applies a magnetic field to the object 56. This magnetic field aligns the spin axes of rotating nuclei (e.g., hydrogen atom protons) within the object 56. An RF transmitter 62 generates a radio frequency (RF) pulse of a particular radio frequency (called the "Larmor frequency"). This RF pulse is connected by a "transmit/receive" ("T/R") switch 64 to RF coils 66 which apply a corresponding RF magnetic field to the body 56. The RF field temporarily stimulates the nuclei in object 56, causing the axes of their spins to be realigned. When the RF field is switched off, "relaxation phenomena" cause the nuclei to return to their non or less stimulated states. As the nuclei return to such non or less stimulated states, they generate their own RF magnetic field (the "NMR" signal).

The NMR signal "echo" induces a voltage into RF coil 66. An electronic RF receiver 60 (which is connected by the "T/R" switch 64 to the RF coil 66 between RF pulse transmission) receives, amplifies, filters and detects the induced voltage to provide a pair of analog time-varying output signals. These output signals are then applied to an analog-to-digital converter pair (ADCs) 70 for conversion into signed binary integers. ADC 70 samples the signals at fixed time intervals and outputs the sampled results as numerical digital data. Sets or matrices of this numerical data so obtained are stored and analyzed by computer 50, which "reconstructs" (using complicated but conventional mathematical procedures) amplitude information corresponding to the concentration of nuclei within different volumes of the object. Such reconstructed amplitude information is used to generate a high quality image of the internal structure of the object, which can be displayed on a display screen 58, printed onto film for later viewing, etc.

Figure 2A:
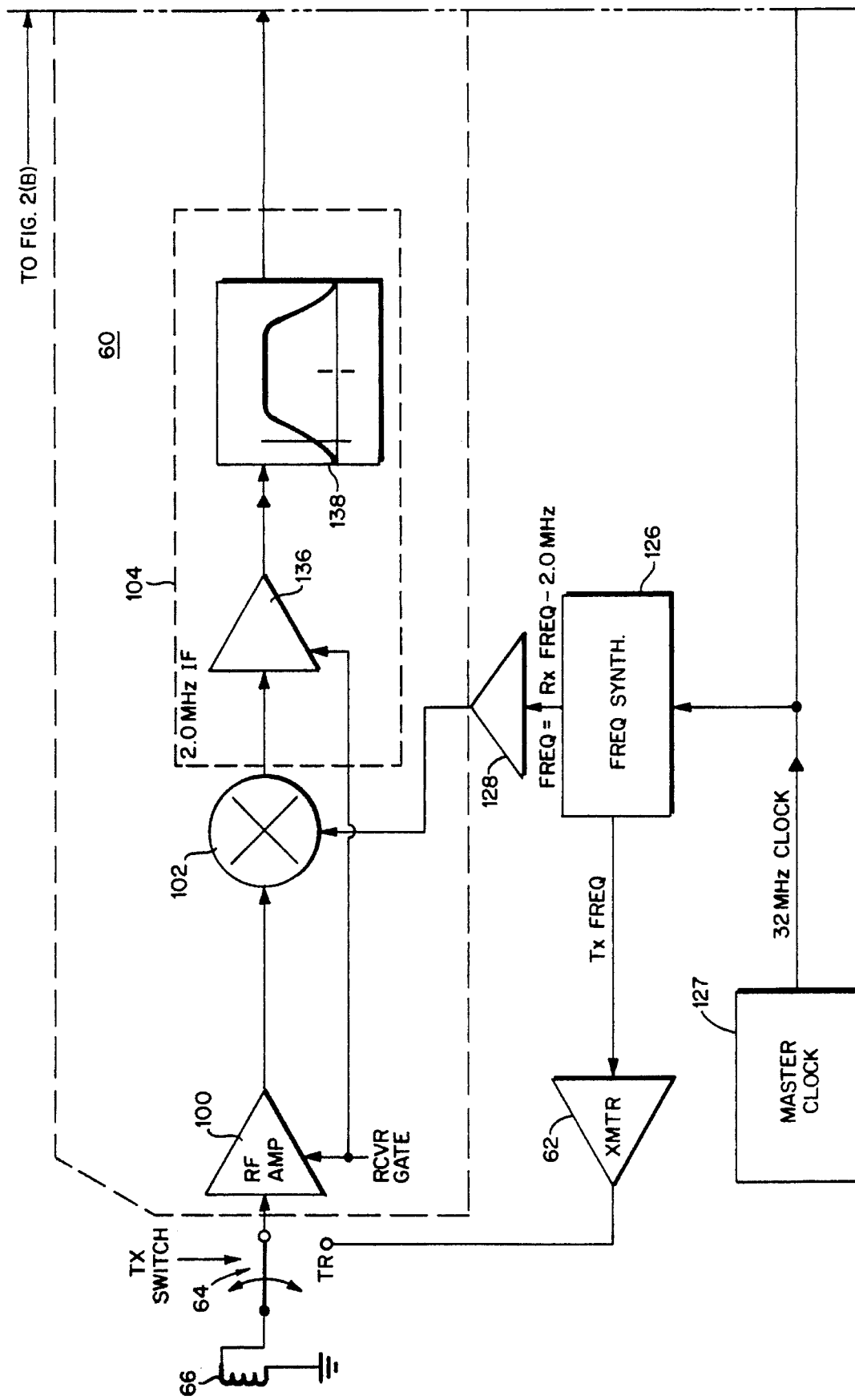
FIG. 2A–2B together are detailed block diagram of the prior art analog RF receiver shown in FIG. 1.
Figure 2B:
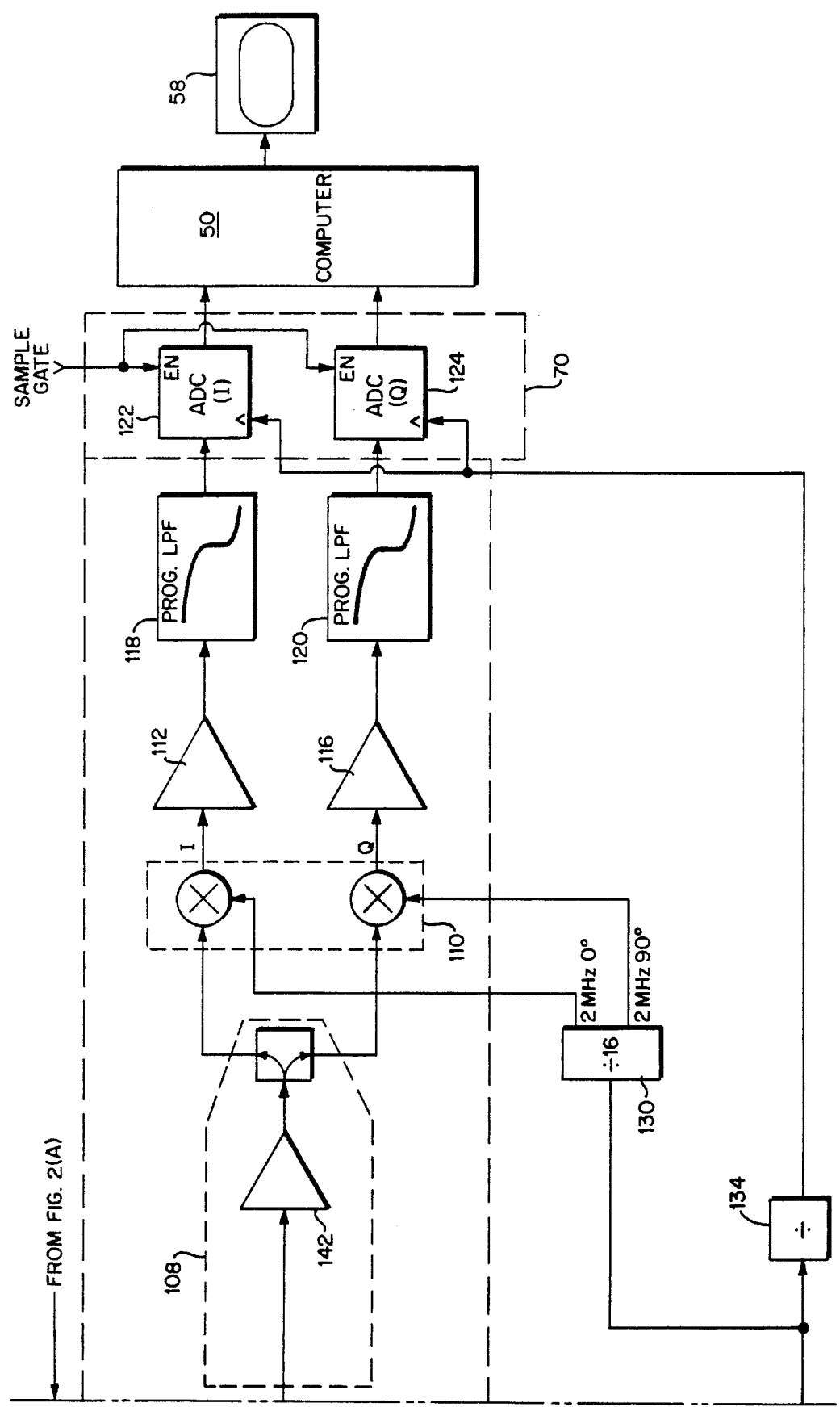

FIGS. 2A–2B together provide a schematic block diagram of prior art analog RF receiver 60 and ADC 70 shown in FIG. 1. The T/R switch 64 connects RF coil 66 to receiver 60 under control of a signal called "TX SWITCH" generated by real time microcoded control sequencer 52 after the time the sequencer controls the transmitter 62 to stop generating an RF pulse. The TX SWITCH control signal also controls T/R switch 64 to disconnect the RF coil 66 from the receiver 60 and reconnect the coil to transmitter 62 just prior to the time the sequencer controls the transmitter to generate the next RF pulse. A "RCVR GATE" control signal also activates and deactivates receiver 60 components during operation of transmitter 62 to prevent the components from being overloaded.

Receiver 60 is a conventional single (or more) conversion superheterodyne type receiver including an RF preamplifier 100, a mixer 102, an intermediate frequency ("IF") sections 104 and 108, and a quadrature detector 110. RF amplifier 100 amplifies the received RF signal and applies it to mixer 102. Mixer 102 also receives a local oscillator frequency generated by programmable frequency synthesizer 126 and buffered by amplifier 128. In the preferred embodiment, frequency synthesizer 126 produces an local oscillator output that is synchronized with a master clock 127 time base, and also produces a transmitter local oscillator output used to control the output frequency of transmitter 62. Mixer 102 down-converts the NMR signals to the intermediate frequency (e.g., on the order of 2 MHz) for amplifying and filtering by IF sections 104 and 108.

IF section 104 includes an IF amplifier 136 that amplifies the down-converted signal and passes it on to an IF bandpass filter 138. The passband of bandpass filter 138 selects the "difference" output and rejects the "sum" output from first mixer 102—and also rejects out-of-band signals. The filtered output is buffered and equally split into two signals by an amplifier 142. The split outputs of IF section 108 are inputted to second mixers (quadrature detector) 110, which down-convert the received NMR signal frequency to baseband. The 32 MHz master clock signal is divided by a digital divide-by-16 circuit 130 to provide 2 MHz signals of 0° and 90° phases for quadrature detection. These are applied as local oscillators to the mixers 110. This quadrature detector 110 thus provides quadrature detection by demodulating the output of the IF section 108 into two different channels ("I" and "Q", which stand for "Inphase" and "Quadrature", respectively) 90 degrees apart in phase.

The "I" channel output of quadrature detector 110 is amplified by amplifier 112 before being filtered by anti-aliasing lowpass filter 118 and sampling by ADC 122. Similarly, the "Q" channel output of quadrature detector 110 is amplified by amplifier 116 and filtered by anti-aliasing lowpass filter 120 before being sampled by ADC 124. In this design, filters 118, 120 are programmed, matched lowpass filters used to prevent aliasing. As is well known, the selection of a sampling rate imposes a maximum permissible bandwidth on the signal being sampled. If the signal bandwidth exceeds this maximum permissible bandwidth, then sampling will have the effect of "folding over" ("aliasing") parts of the signal spectrum into other parts of the signal spectrum, thereby introducing distortion that cannot effectively be removed. Filters 118, 120 reduce the amplitude of such aliased spectral components ahead of the sampling of ADCs 122, 124.

The rate at which ADC 122, 124 sample is programmable via digital divider 134. These ADCs 122, 124 sample only during the time the "SAMPLE GATE" signal is active. SAMPLE GATE is on for only part of the time that RCVR GATE is on. The outputs of ADCs 122, 124 are provided to computer 50, which uses them to determine real and imaginary numerical values and create a data set from hundreds or thousands of samples acquired during the course of an MRI "experiment." Based on the acquired data set, computer 50 reconstructs a one, two or three-dimensional amplitude data set using Fourier transforms, and displays a corresponding image.

Figure 3A:
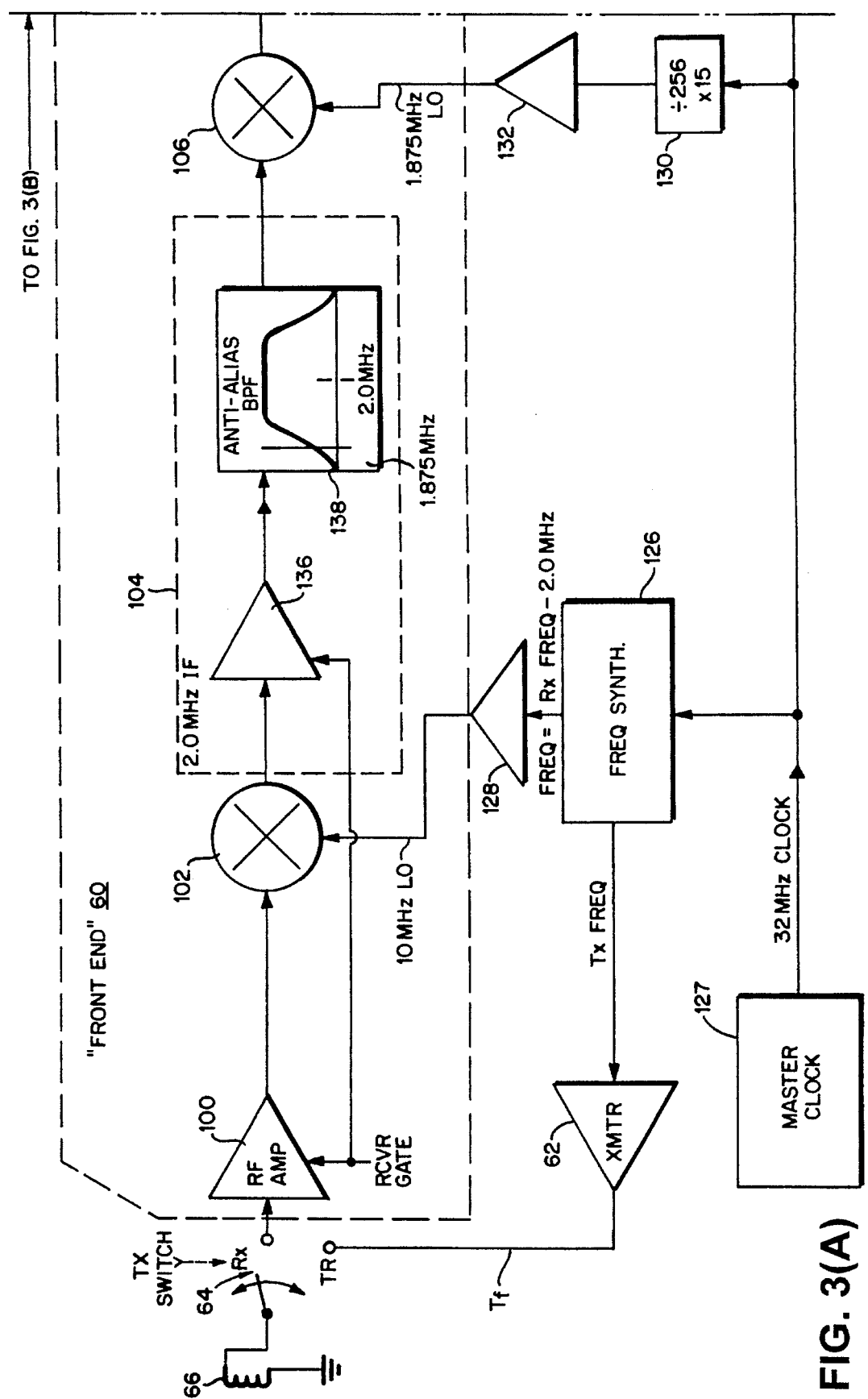
FIG. 3A–3B together are a derailed block diagram of a presently preferred exemplary embodiment of an MRI digital receiver in accordance with the present invention.
Figure 3B:
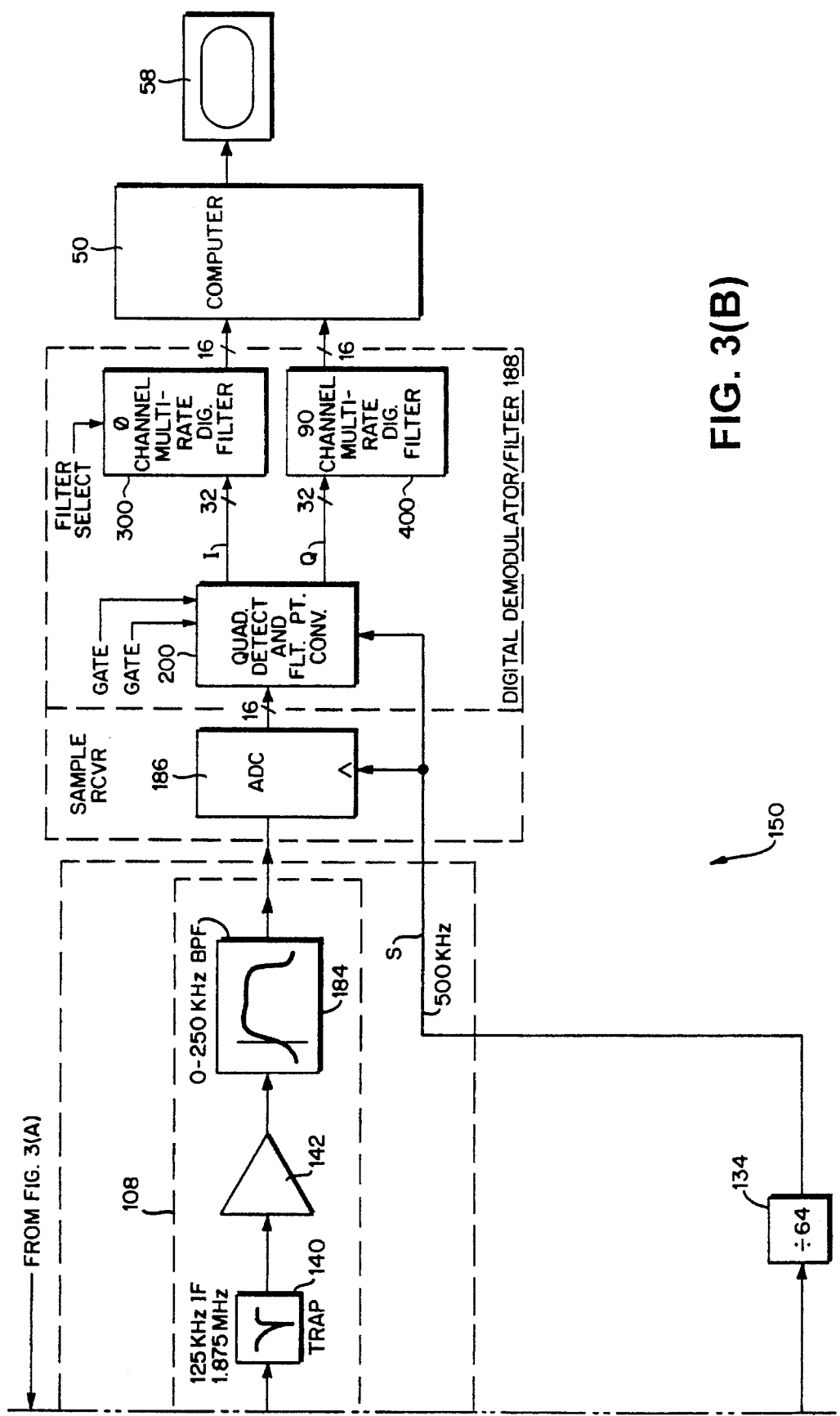

FIGS. 3A–3B together are a schematic diagram of a presently preferred exemplary embodiment of a digital receiver provided by the present invention. A comparison of FIGS. 3A–3B with prior art FIGS. 2A–2B reveals that the preferred embodiment digital receiver is similar to the prior art analog receiver in certain respects. Like the analog receiver, digital receiver 150 receives an RF input from an RF coil 66 via a T/R switch 64 which also selectively couples the output of RF transmitter 62 to the RF coil. As in the prior art analog receiver, digital receiver 150 couples this received input from T/R switch 64 to the input of an RF amplifier 100 to produce a signal that is heterodyned ("down converted") by a mixer 102 to a 2.0 MHz intermediate frequency. As in the prior analog receiver, digital receiver 150 amplifies the down-converted signal with an IF amplifier 136, and then passes the amplified signal to a bandpass filter 138. In the digital receiver, this bandpass filter 138 acts as an anti-alias filter in addition to selecting the desired "difference" output of mixer 102. Thus, the filter must be sharper than in the analog version. Unlike the analog RF receiver of the prior art, the preferred embodiment digital receiver 150 uses a further mixer 106 to down-convert the output of first IF section 104 to 125 Kilohertz for further filtering and amplification by a second IF section 108. Mixer 106 uses a 1.875 MHz local oscillator to perform this down conversion. This local oscillator is derived from the master clock 127 by frequency divider/multiplier 130 which performs the following operations: 15*(32 MHz/256)=1.875 MHz. The local oscillator is buffered by amplifier 132. This extra conversion makes this example digital receiver a dual conversion superheterodyne. From this point on, processing is performed very differently in the digital receiver as compared to the prior analog receiver.

Digital receiver second IF section 108 includes a trap 140 that removes any residual 1.875 MHz local oscillator component from the output of the mixer 106. This reduces any saturation of the following amplifier 142 by this unwanted signal. Amplifier 142 increases the signal from the mixer output level to that needed for signal sampling. The output of amplifier 142 passes through a 0–250 KHz bandpass filter 184 used to reject out-of-band signals in order to prevent aliasing. The output of IF section 108 is sampled with an analog-to-digital converter ("ADC") 186 to produce a stream of periodic samples. In the preferred embodiment, ADC 186 has a signed amplitude resolution of 16 bits and thus produces a 16-bit wide digital output for each sampling. In the preferred embodiment, the timing at which ADC 186 samples is determined by a sample timing signal S which is derived from master time base 127. As shown in FIG. 3A, the RF transmit carrier frequency "TX FREQ" is determined by a frequency synthesizer 126 that is also derived from master time base 127. Master time base 127 is used as a common clock signal to generate: 1) the RF signal transmitted by transmitter 62, 2) the local oscillator frequencies for mixers 102 and 106 that down convert the signal and, 3) the sampling times of ADC 186. This ensures that there is a fixed relationship between the phase of the RF carrier (and thus of the NMR phenomena) and the ADC sampling times. This means that in the preferred embodiment the sampling times of ADC 186 are phase locked with the MRI phenomena occurring within the object being imaged. A fixed frequency divider 134 and a frequency divider/multiplier/ 130 provide a phase consistent relationship between the samples performed by ADC 186 and the frequency of the RF carrier output by the second IF amplifier.

The output of ADC 186 is applied to a quadrature detector and floating point converter block 200. In the preferred embodiment, detector/converter 200 is a digital signal processor ("DSP") appropriately programmed to perform quadrature detection and floating point conversion. DSP 200 generates two output channels (I and Q) in quadrature relationship. Assuming that the ratio between ADC 186 sampling frequency and the carrier frequency of the second IF stage 108 is four-to-one as in the preferred embodiment, block 200 can perform quadrature detection by multiplexing with alternating sign inversions, i.e., by sending received samples alternately to the I and Q channels such that each channel receives every other sample. The signs of the samples are periodically reversed.

Figure 4A:
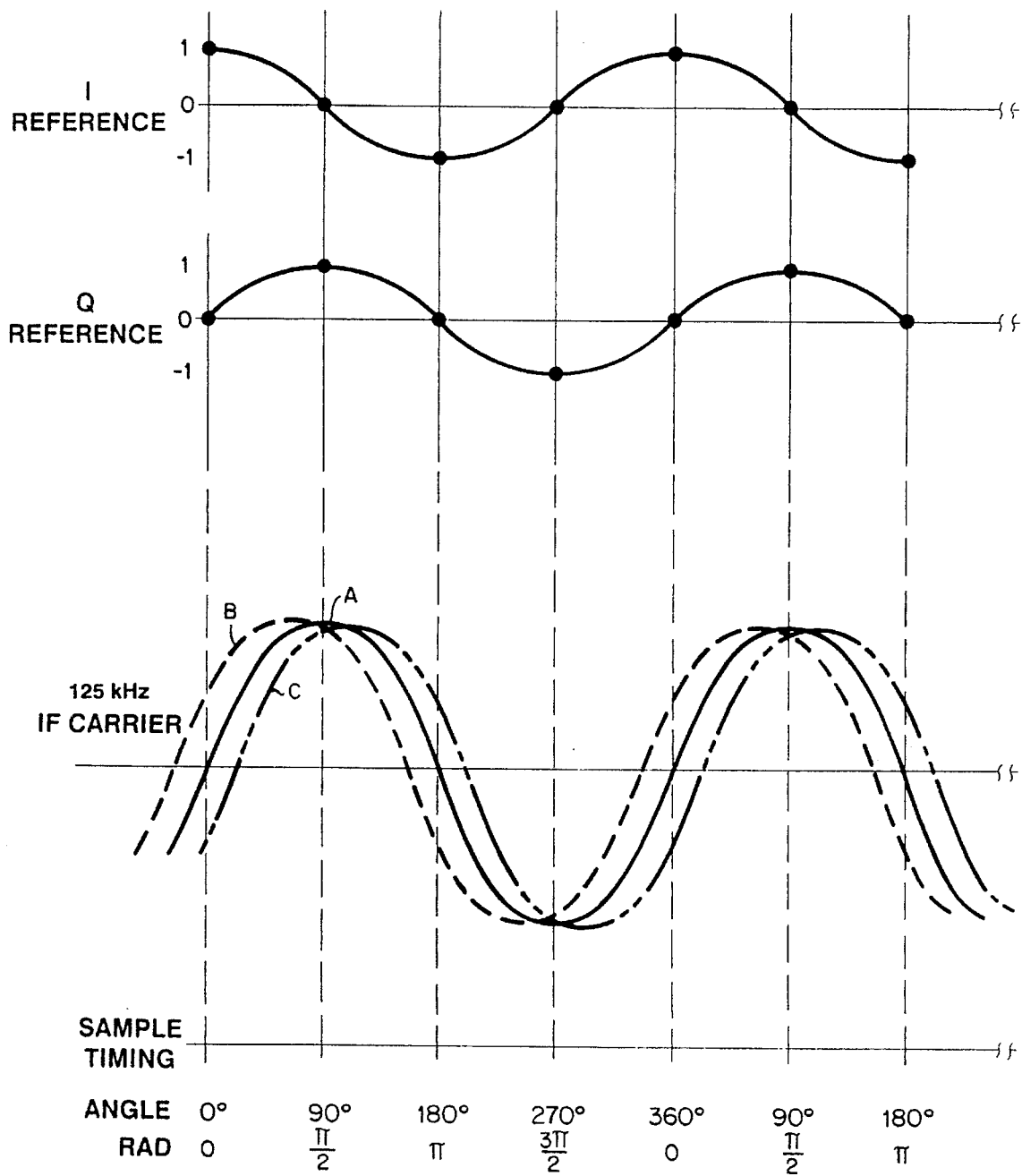
FIGS. 4(A)–4(C) are graphical illustrations of exemplary timing relationships between analog-to-digital converter sampling times and RF carrier phase in the preferred embodiment system shown in FIGS. 3A–3B.
Figure 4B:
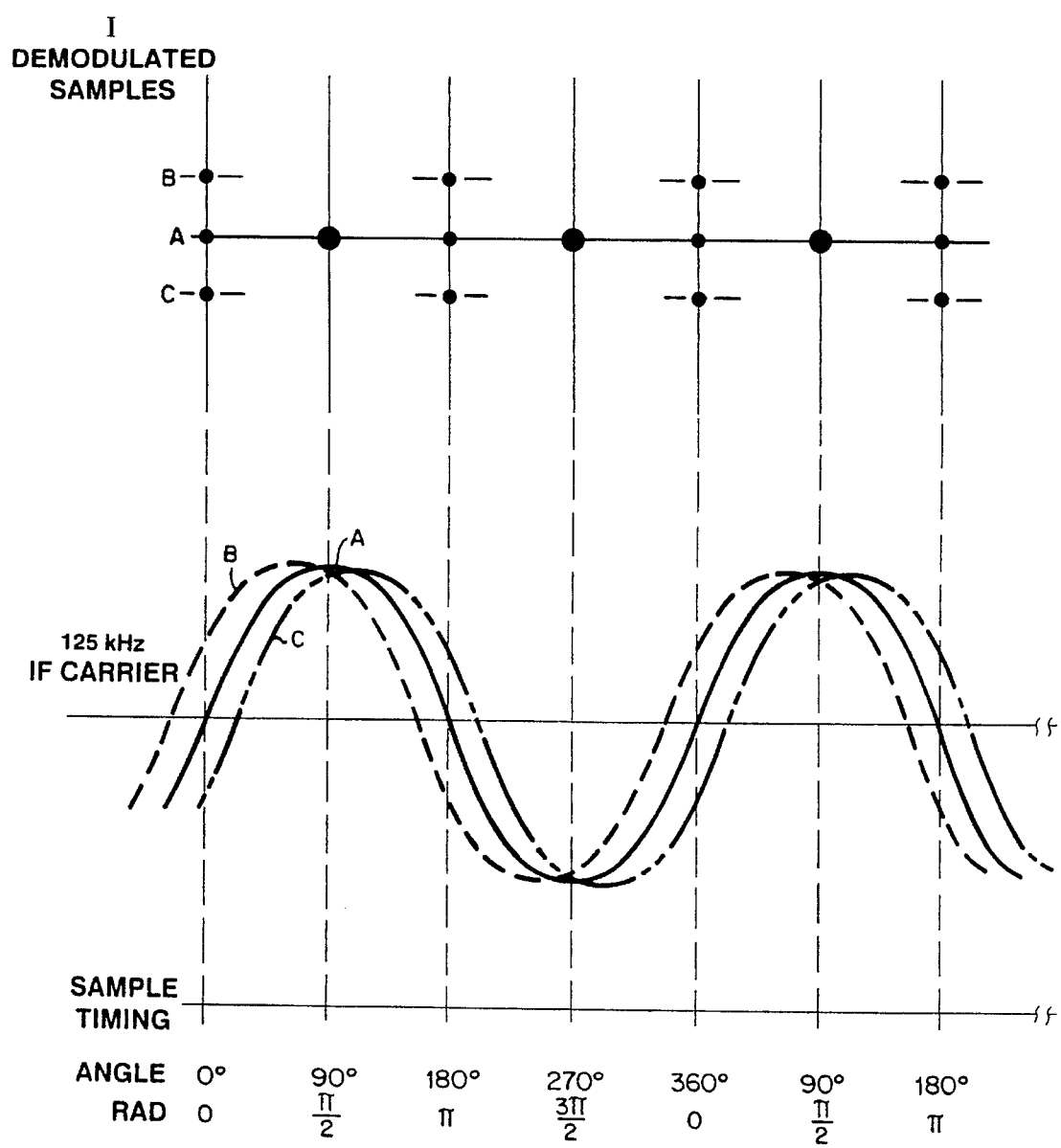
Figure 4C:
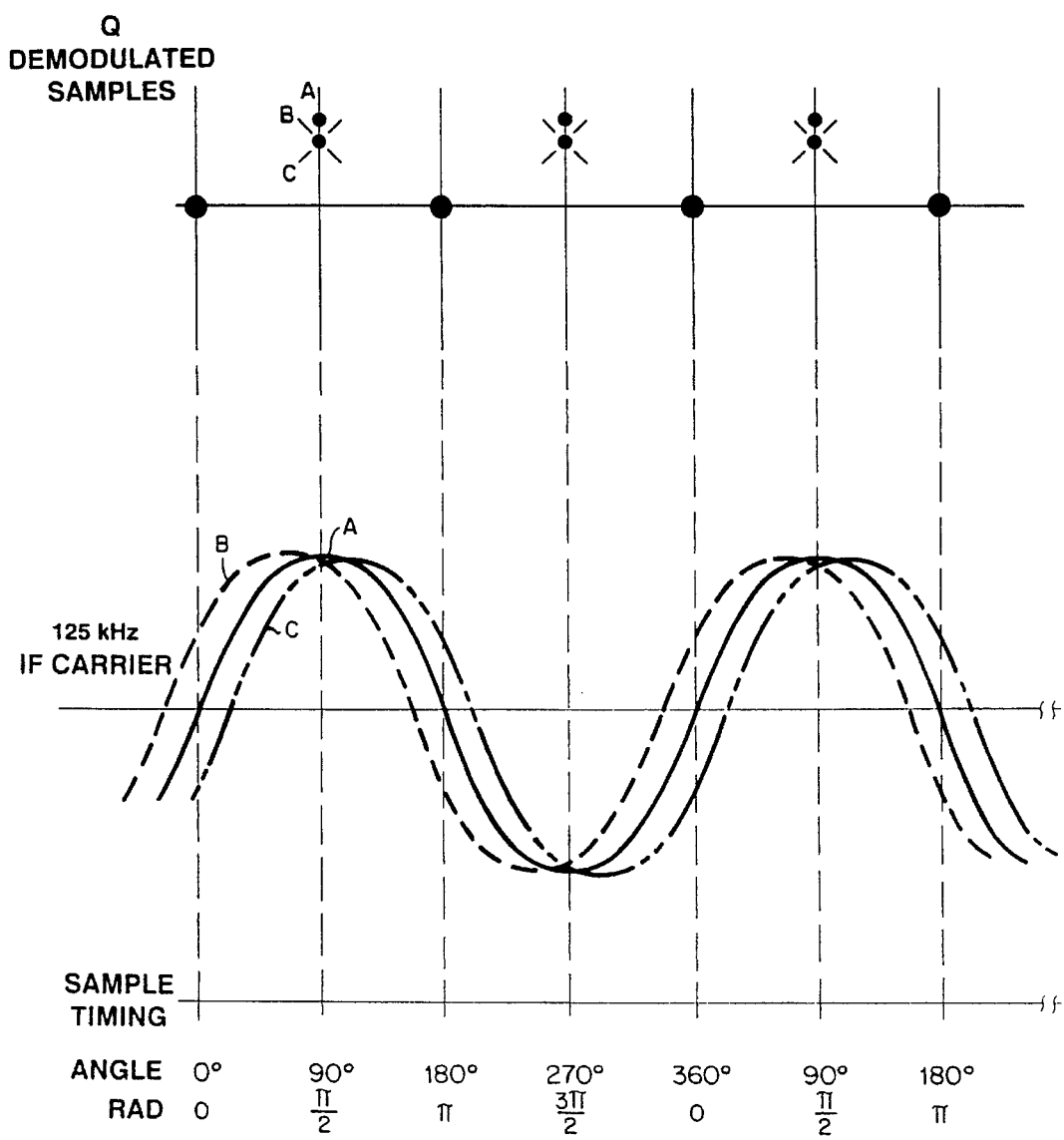

FIGS. 4(A)–4(C) graphically show an example of quadrature demodulation within the preferred digital receiver of FIGS. 3(A)–3(C). FIG. 4(A) shows the I ("in-phase") and Q ("quadrature") sine waves that could be used in an analog demodulation of the signal. The "dots" on the sine waves show samples of these reference signals. As mentioned above, it is not important (nor is it typically even possible) to achieve any particular desired relationship between the absolute phase of the IF carrier and the sample timings. These samples are multiplied by the sampled signal at these times to result in the I channel having non-zero values at 0° and 180°, and the Q channel having non-zero samples at 90° and 270°. Note that the reference signals in this example are 1, 0, −1, 0.

FIG. 4(B) shows the product of signals A, B and C with the I reference samples. The "1" samples pass the value through while "−1" samples pass the value through with a sign inversion. The "0" samples just pass a zero through. Since the A wave has 90 degree phase, it is always zero when I is demodulated. Ignoring the samples where the reference is zero (the large "dots"), the B wave is turned into a DC value equal to the B level at 0 degrees. Similarly, the C wave also becomes a DC level (it is negative because it has a phase lag). The Q demodulation shown in FIG. 4(C) is similar except that its non-zero values are one step later. The demodulated DC value of A is now maximum because it is in phase with Q, it has a 90 degree phase. Waves B and C are also positive. Again, the reference zeros pass zero through (the large "dots").

As can be seen in FIGS. 4(B) and 4(C), all of the samples that are zero because the reference is zero are known ahead of time. They don't produce any useful filter input so they need not be passed along (in fact, in the preferred embodiment they are not even created and the digital filtering process is designed so as to not need these zeros). When the carrier-to-sampling ratio is not 4:1 these steps would not necessarily be zero and the digital receiver would have to carry the product results along—thereby doubling the calculations needed in the filters.

In the preferred embodiment the detector/converter block 200 also converts the 16-bit-wide digital samples provided by ADC 186 into 32-bit wide floating point format for more precise processing by following digital filtering blocks 300, 400. The digital filtering blocks 300, 400 digitally filter respective I,Q channels in floating point format, and may convert the resulting digitally filtered values back to 16-bit-wide fixed point precision representation suitable for further processing by control computer 50.

Achieving and Maintaining Phase Synchronization

As discussed above, the ADC 186 sample timing is locked to the RF carrier phase in the preferred embodiment. As shown in FIGS. 4(A)–4(C), the absolute phase relationship between the ADC 186 sampling time and the received NMR carrier signal is not necessarily known—nor need it be. The ADC 186 sampling times may correspond to different absolute phase angles of the received RF carrier (see family of exemplary IF carrier curves A, B, C). What is important is that the ADC 186 sampling times consistently correspond to the same RF carrier phase angles for each RF carrier cycle throughout an NMR experiment. This ensures internal consistency between the digitally sampled, digitally processed data set output by the digital receiver 150 during an experiment and the phase of the NMR phenomena occurring within the object being imaged.

As also indicated in FIGS. 4(A)–4(C), the preferred embodiment sets the division ratio of divider 134 appropriately so that there are four (4) evenly-spaced sample times for each cycle of the (suppressed) 125 KHz IF carrier provided to the input of ADC 186. This 4-to-1 ratio provides oversampling of the carrier (i.e., sampling at a rate in excess of the Nyquist sampling theorem rate), and also provides added convenience for quadrature detection. The highest frequency sideband, 125 KHz above the carrier, just reaches the 250 KHz Nyquist frequency. Different ratios between sampling frequency and the second IF frequency could be used but require more complex demodulation processing. Integer ratios provide the simplest process and conveniently ought to be evenly divisible by two.

Figure 5:
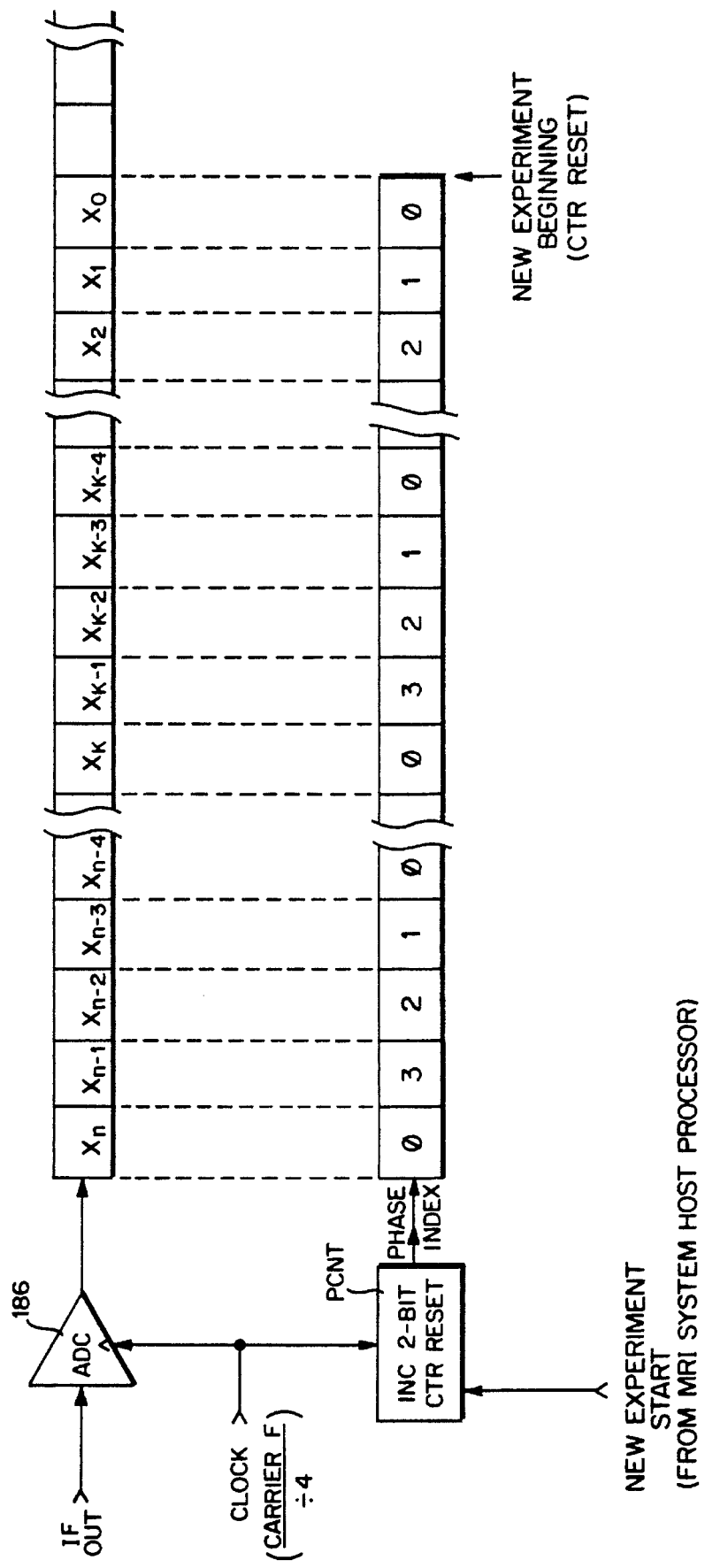
FIG. 5 is a schematic illustration showing generation of a "phase index" in accordance with the preferred embodiment shown in FIGS. 3A–3B.

FIG. 5 is a schematic illustration showing a stream of digital samples provided by preferred embodiment ADC 186, and a "phase index" generated by the preferred embodiment to keep track of the phase relationship between each digital sample and RF carrier phase. FIG. 5 shows ADC 186 producing a stream of samples $X_0$-$X_n$, with sample $X_0$ being a "first" (arbitrarily selected) sample occurring sometime at the beginning of a given MRI "experiment" prior to acquisition of meaningful NMR signal data. FIG. 5 also shows an additional mechanism PCNT for producing and maintaining a phase index. Mechanism PCNT provides a stream of phase index values corresponding to the stream of digital samples produced by ADC 186. In the example shown, mechanism PCNT may comprise, for example, sequential state logic that is set to an initial output state upon the occurrence of arbitrarily selected sample $X_0$, and changes output state each time ADC 186 samples the incoming signal. For example, mechanism PCNT may comprise a 2-bit counter having a total of four different output states ("0", "1", "2" and "3") that occur in an ordered, repeating sequence, with the counter changing to the next output state in the ordered sequence each time the ADC 186 produces another sample. It may also be implicit to the state of the demodulator. In the example shown, a sequence of ADC 186 samples $X_k$, $X_{k+1}$, $X_{k+2}$, etc. will correspond to an ordered sequence of phase index values "0", "1", "2", "3", "0", "1", "2", "3", "0", etc. in a repeating fashion for the duration of the MRI experiment—with each next successive ADC sample having a corresponding "incremented" phase index value.

The phase index is used to correlate the stream of ADC samples with the periodically repeating phase of the RF carrier signal used by system 52 to generate NMR phenomena in the object being imaged. The preferred embodiment equates the arbitrarily selected sample time $X_0$ to a "zero" phase reference. Since the ADC 186 continually samples at a rate/timing which is tied to the RF carrier phase/frequency, this "zero" phase reference establishes a relative phase reference with respect to any/all of: (a) the transmitted RF carrier, (b) the NMR phenomena the object is undergoing, and (c) the received down-converted IF (suppressed) carrier input to the ADC. The phase index thus indicates the phase relationship of any given ADC sample to the reference phase—which is tied to some predetermined (albeit not absolute) phase of the RF carrier signal. Since the phase index and ADC sample timing is generated based on the same master clock signal used to generate the RF carrier for stimulating the nuclei, the phase index is always in "phase lock" with the RF carrier. Digital demodulator/filter 188 ensures that phase lock is maintained (and that no phase errors are introduced) by ensuring that all processing of the ADC 186 samples observes this phase index.

In summary, the preferred embodiment ADC samples at times that are locked to the phase of the RF carrier, and the explicitly or implicitly generated phase index provides—consistently throughout an MRI experiment—a way to determine the phase (relative to RF carrier phase) of any given sample time with respect to a reference phase. Because the sample timing in conjunction with the phase index effectively captures all phase relationship information necessary and sufficient to maintain phase lock, it is not critical or even necessary to the phase locking process to process the samples in a time-ordered sequence (or even in a causal real time manner if achieving and maintaining phase lock was the only consideration). For example, one may store the stream of digital samples in a buffer with explicit or implicit reference to the phase indices corresponding to the samples—and then non-causally process any/all of the samples out of the buffer in any desired sequence without losing phase lock. This process of "fully capturing" phase information at sampling time is unlike (and more flexible than) the prior art analog receiver shown in FIGS. 2A–2B—which relied on synchronized time-coherent filtering/sampling of incoming signals in the two quadrature channels in real time in order to achieve and maintain phase lock.

As mentioned above, the phase-tracking mechanism PCNT shown in FIG. 5 may be implemented straightforwardly as a two-bit digital counter. Since the preferred embodiment provides an analog-to-digital conversion frequency locked to the RF carrier frequency, the counter can increment for each predetermined angular displacement of the received IF carrier signal (e.g., every 90°). The counter output may then be used to keep track of the signal phase—and the rest of the digital receiver (e.g., the demodulator and the digital filter processes) can be turned on and off as needed throughout the experiment. The quadrature demodulator 200 may read the current phase from the counter PCNT locked to the IF carrier. As one example, a separate explicit 125 KHz counter PCNT can be set up for the specific purpose of keeping track of the phase index. The demodulator 200 can be started by the RCVR GATE control signal, and can read the phase as two bits. Only two bits are necessary since the ADC 186 samples at 500 KHz which means that there are only 4 possible phases of the modulated IF signal with 125 KHz suppressed carrier. The preferred embodiment implementing this technique checks the phase counter immediately after enabling the output of data from the demodulator 200. The demodulator 200 may then start appropriately and compute the demodulated data outputs while also updating PCNT continuously.

In an alternative implementation, the digital receiver quadrature demodulator 200 can be operated continuously during an entire MRI experiment. This is possible since the ADC 186 runs continuously. In this implementation, demodulator 200 includes program-controlled processes that implicitly keep track of the phase index. By continuing to process even during times when the data is non-valid (e.g., during the excitation stage when the RF transmitter is activated), the digital receiver demodulator 200 never loses phase synchronization and therefore does not have to be resynchronized upon reception of each new NMR signal. In the preferred embodiment of this implementation, a separate digital signal processor is provided with a dedicated function of maintaining phase lock and demodulating the NMR signal—and through software, imposing a phase index onto each of the samples it receives from the ADC 186. Since the demodulator is always active during operation of the digital receiver, it never misses an input and thus maintains the phase index. The RCVR GATE signal from sequencer 52 can arrive at any time and it will not effect the phase of the demodulated signal of successive data acquisitions output to the digital filters.

A still alternative technique is to effectively build the "phase index" generator PCNT into the MRI control sequencer 52 or into logic associated with it. If the sequencer 52 never stops during a given MRI experiment and all time intervals are modulo the sample period of the ADC 186 (currently 2 microseconds), then the synchronized starting of the sequencer 52 (to avoid race conditions) insures that the demodulator 200 will be, and remain synchronized to the IF carrier. This assures that the sequencer 52 is synchronized for generation for time intervals with the RF reference clock 127 which is also used to generate the conversion clock for the ADC 186. The phase of the IF carrier will then be constant at the beginning of each sample window for all projections from a particular volume. In a multi-slice imaging protocol, the phase of each projection from each volume will vary but will be constant for all signals received from each slice (this is easily demonstrated by turning off the phase encoding and read-out gradient for a multi-slice protocol and observing the phase in the time domain for each slice).

The control sequencer 52 timing logic can include appropriate gating which keeps track of the phase of the RF carrier signal and allows the control sequencer to generate a RCVR GATE timing control signal that is synchronized with the phase of the analog-to-digital conversion clock. Using this technique, the MRI microcoded digital sequencer 52 used to generate the RCVR GATE timing control can be synchronized with the phase of the analog-to-digital conversion clock so that it always turns the digital demodulator/filter 188 "on" at a consistent predetermined phase relative to the RF carrier. This ensures that the digital demodulator/filter 188 will always process the digital samples in a phase-coherent manner from one acquisition cycle to the next. Such synchronization establishes relative phase lock within the measurement process by ensuring that the digital demodulator/filter 188 always becomes active at a predetermined phase relative to the sampled outputs generated by the analog-to-digital converter. If this technique is employed, care must be taken to ensure that the "receiver on" control signal does not jump from one phase to another due to race conditions. To implement this approach, it is preferable to run the sequencer 52 continually during the experiment to ensure that it maintains the state of the "phase index" throughout the experiment.

If it is desired to turn the sequencer on and off during the experiment, it is necessary to provide a way in which the sequencer can be started reliably each time in an ordered, phase-coherent manner at a particular consistent phase reference point relative to the RF carrier phase. If the sequencer 52 stops, then the restarting of the next portion of the MRI sequence must be synchronized with the carrier. This can be achieved by starting the sequencer 52 synchronously with a 125 KHz reference clock. A two-bit counter can be used to monitor this reference clock. Thus, even in this approach, it is preferable to continually operate, throughout the MRI experiment, (a) the ADC 186, and (b) some sequential state logic that keeps track of the phase index. Since the instructions executed by the sequencer 52 have been modified in the preferred embodiment to be modulo the RF carrier period as well as modulo the sample period of the ADC 186, a pause to reload the sequencer 52 and restart it will not lead to any loss of phase lock.

One Example of a Preferred Detailed Implementation

Figure 6:
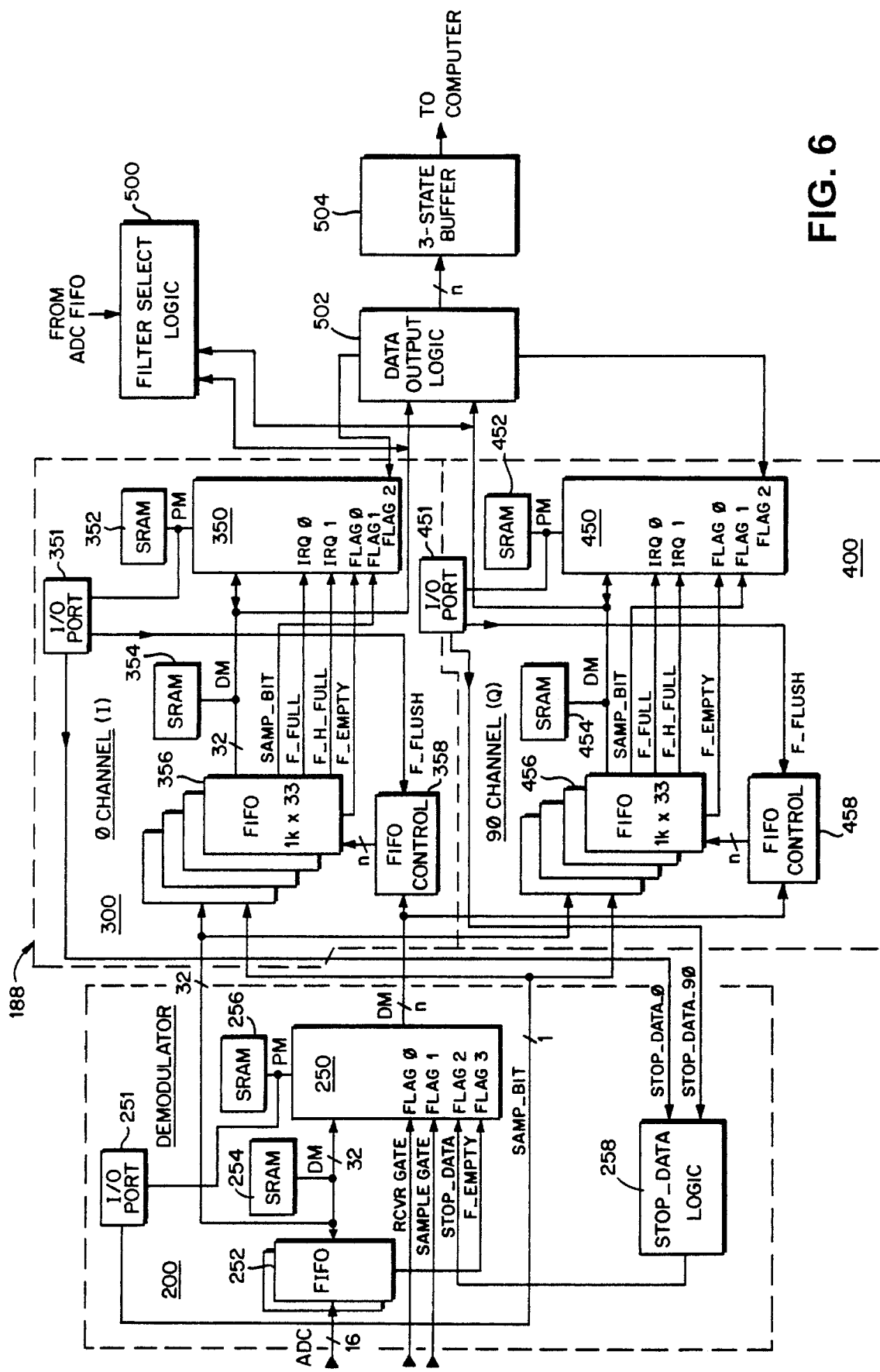
FIG. 6 is a more detailed schematic block diagram of one exemplary implementation of the blocks 200, 300, 400 shown in FIG. 3B.

FIG. 6 is a block diagram of one exemplary preferred architecture for the demodulator 200, digital filter 300 and digital filter 400 blocks of digital demodulator/filter 188 shown in FIGS. 3A and 3B. Each of blocks 200, 300, 400 in this preferred embodiment includes a digital signal processor (e.g., DSP model ADSP 21020). Thus, the demodulator 200 is built around the DSP 250 and supporting memory devices 252, 254, 256 and supporting logic 251, 258. Digital filter 300 is similarly built around a DSP 350 and supporting memory devices and associated control logic 351, 352, 354, 356, 358—and similarly, digital filter 400 is built around the DSP 450 and supporting memory components and associated control logic 451, 452, 454, 456, 458. Digital samples produced by ADC 186 are stored in FIFO (first-in-first-out) output buffer) memory 252 for processing by demodulator DSP 250. The demodulator DSP 250 outputs two output streams in quadrature (I and Q), which are stored respectively in FIFO memory 356 and FIFO memory 456 for processing by digital filter DSPs 350, 450, respectively. Interrupt routines are used to support FIFO I/O to/from the DSPs 250, 350, 450 in the preferred embodiment. SRAM memories 256, 352, 452 are used by the respective DSPs 250, 350, 450 as program RAM. SRAM memories 254, 354, and 454 are used by the respective DSPs 250, 350, 450 as "work RAM" for storing intermediate values used during computation. I/O ports 251, 351, 451 allow communication with the host computer and provide signaling between DSPs. Data output logic 502 provides the digitally filtered quadrature outputs of digital filter DSPs 350, 450 to computer 50 via buffer 504.

In the preferred embodiment, up to four different filters and numbers of points can be selected by the MRI sequencer 52. In the preferred embodiment, data from I/O ports 351, 451 are latched by the filter select logic 500 so that the digital filtering DSP's 350, 450 can access the information and set the correct filter (e.g., upon initialization and then as soon as possible after the end of each SAMPLE GATE). The digital filter DSPs 350, 450 see their FLAG0's asserted after RCVR GATE is asserted when demodulator DSP 250 begins filling FIFO's 356, 456, since the "empty" flag goes off. They begin input of data from the FIFO's 356, 456 at that time. If the DSP's 350, 450 fall behind the rate of data transfer, an interrupt IRQ1 occurs to expedite data transfers to the data input buffer in DM SRAM 354, 454. The digital filter DSP's 350, 450 get a signal (based on the demodulator 250 asserting its FLAG3 in response to SAMPLE GATE) on FLAG1 when the SAMPLE GATE bit comes out of the FIFO's 356, 456. This allows synchronization of the digitized data stream within the sample window defined by SAMPLE GATE (see FIG. 8). The I and Q channels run to completion, and then set an I/O port CSR bit to stop the data input by demodulator DSP 250 to the FIFO's 356, 456. They also assert an I/O port CSR bit to flush the FIFO's 356, 456.

In this preferred embodiment, demodulator DSP 250 operates continually throughout the MRI experiment in order that it may keep track of the phase index as discussed above. However, no data is transferred from it to the digital filtering DSPs 350, 450 until the RCVR GATE edge occurs. The FIFO input memories 356, 456 for the digital filters 300, 400 respectively, are empty up to this event.

FIGS. 7A–7E are flowcharts of exemplary program control steps performed by the preferred embodiment to quadrature demodulate input samples from ADC 186 and to maintain the phase index discussed above. Briefly, the process shown in FIGS. 7A–7E acquires and processes the RCVR GATE and SAMPLE GATE signals to control the demodulation and conversion to 32-bit floating point representation of the 16-bit data stream incoming from ADC 186. Data is acquired continuously to maintain phase lock with the incoming suppressed carrier. The input data is a carrierless modulated MRI signal which DSP 250 then quadrature demodulates. Demodulation may be done in a straight forward algorithm since the ratio of the carrier frequency to the sample rate is 1:4 in the preferred embodiment. Thus, multiplication by 0, 1, 0, −1 and 1, 0, −1, 0 yield the quadrature signal components (as is discussed above in connection with FIGS. 4(A)–4(C)). Once RCVR GATE is asserted, DSP 250 outputs data to the quadrature output channel FIFOs 356, 456 which also contain a tag for SAMPLE GATE. When sufficient data has been output to the filter channel digital signal processors 350, 450, this is signalled by asserting a DSP DONE ("STOP_DATA") signal on the DSP 250 FLAG2 input. When the outputs are completed, the I and Q channel DSP's 350, 450 deassert STOP_DATA and go back to look at their FLAG0s for the next data set. When the demodulator DSP 250 receives STOP_DATA on FLAG2, it goes to the signal acquisition loop which looks for RCVR GATE to occur again while continuing to increment the phase index counter intPHASE as each sample is acquired from FIFO 252. FLAG2 of DSPs 350, 450 is used to synchronize pairs of data output from each channel to construct each complex pair.

Figure 8:
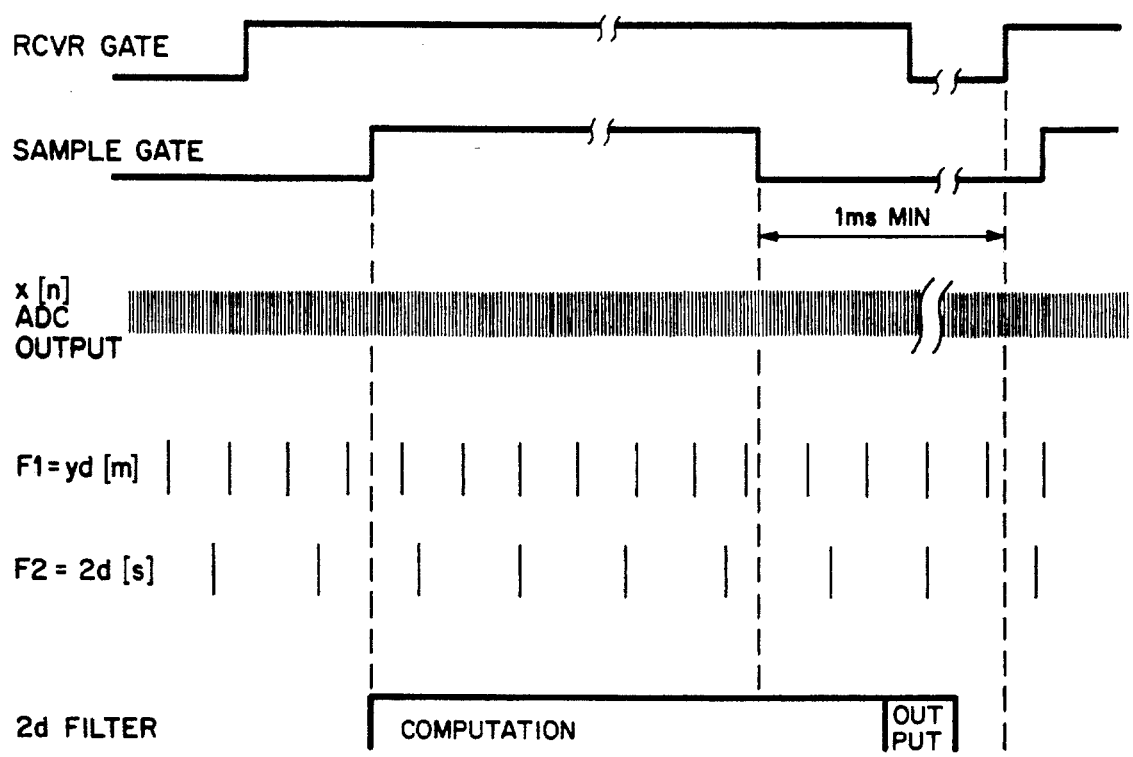
FIG. 8 is a graphical timing diagram showing different signals/operations provided by the preferred embodiments shown in FIGS. 3A–3B.

Referring briefly to FIG. 8 (a timing diagram of some exemplary signals for a MRI signal acquisition phase in the preferred embodiment), the control sequencer 52 generates the signal RCVR GATE to turn digital demodulator/filter 188 "on" and "off". Within the "on" window defined by the RCVR GATE signal, control sequencer 52 generates a SAMPLE GATE signal which establishes a further timing window during which the NMR signal envelope of interest occurs. Demodulator DSP 250 receives both the RCVR GATE and SAMPLE GATE signals, and uses them to control its own processing as well as to coordinate the processing performed by digital filter DSPs 350, 450. Demodulator DSP 250 in the preferred embodiment performs the phase index count incrementing process continually throughout an MRI experiment—both implicitly during times that data is being processed (i.e., during the receiver on "window" during which RCVR GATE is active), and explicitly during times when the digital demodulator/filter 188 is nominally "off" (outside of the RCVR GATE window). In the preferred embodiment, DSP 250 maintains the explicit phase index count intPHASE only when demodulation is not actively occurring, i.e., when data transfers are stopped by the filter channel DSPs 350, 450 or the RCVR GATE and/or SAMPLE GATE signals are not asserted. During active demodulation, the program control steps performed by DSP 250 implicitly keep track of the phase index by stepping through four demodulation "stages" (each implemented in separate code in the preferred embodiment) so that phase synchronization is never lost and the phase index is implicitly maintained. When active demodulation terminates (e.g., because SAMPLE GATE or RCVR GATE are deasserted, or because the filter DSPs 350, 450 have received sufficient dam), DSP 250 explicitly updates the phase index count intPHASE based on the "current demodulation stage" phase information, and DSP 250 returns to a process of updating the explicit phase index counter intPHASE in response to each new incoming sample from ADC 186.

Figure 7A:
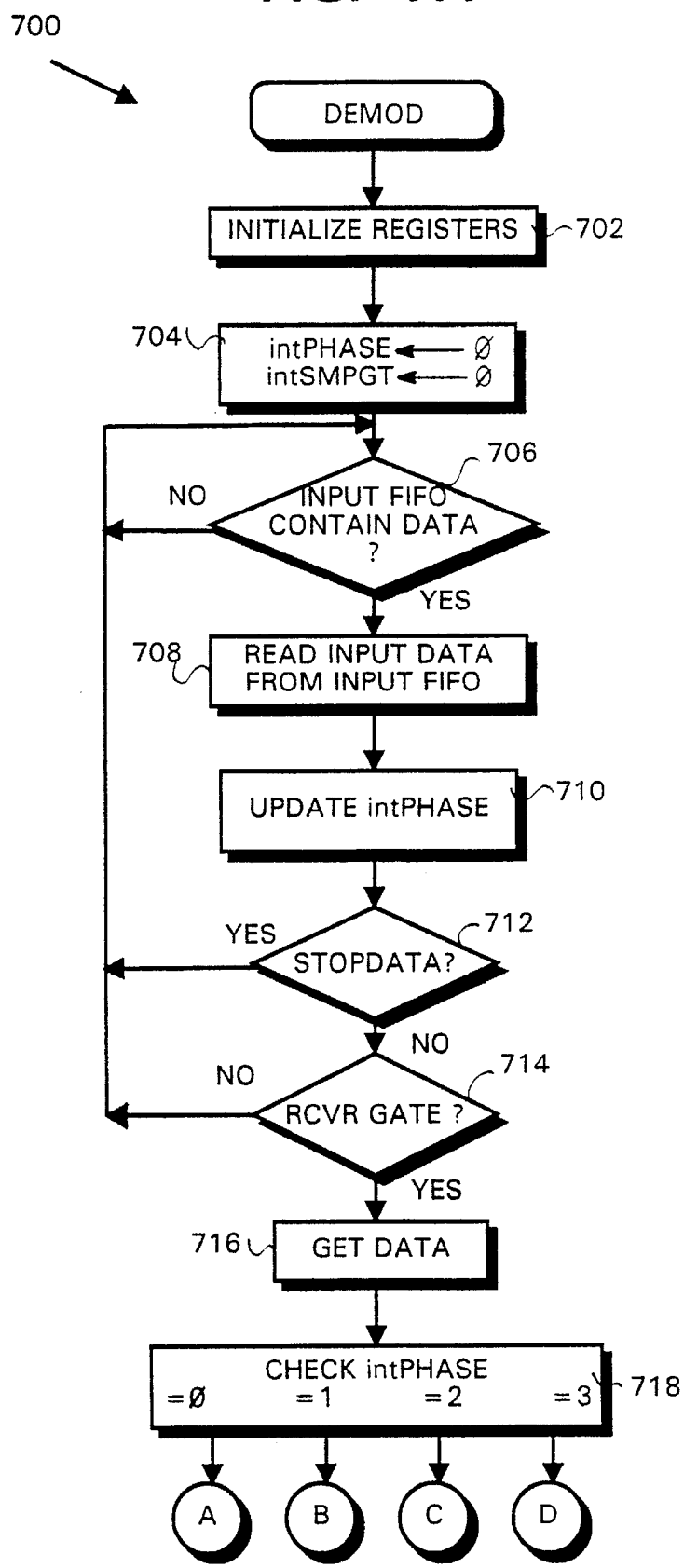
FIGS. 7A–7E are flowcharts of exemplary program control steps performed by the implementation shown in FIG. 10.

FIG. 7A is a flowchart of the preferred embodiment DEMOD routine 700 performed by demodulator DSP 250. When demodulator DSP 250 is first activated, it initializes its working registers (block 702), and then sets the phase index counter intPHASE to 0, and also sets the SAMPLE GATE flag register intSMPGT to 0 (block 704). DEMOD routine 700 then enters a loop (beginning at decision block 706) which increments the phase index counter intPHASE in response to each newly received sample from ADC 186 (blocks 706, 708, 710). This updating process continues until the RCVR GATE signal is asserted (as tested for by decision block 714). Thus, decision block 706 continually checks for dam input from the input FIFO 252 by looking at the value of a flag F_EMPTY (DSP FLAG3) indicating whether the input FIFO is empty. When the input FIFO becomes not empty, block 708 reads the input dam from the FIFO in order to empty it. Next, routine 710 updates the phase index count intPHASE. Routine 700 then checks if the STOP_DATA flag is on (this flag is used by the filter DSPs 350, 450 to signal to the demodulator DSP 250 to stop dam transfers) (decision block 712). If the STOP_DATA flag is on, control returns to decision block 706 to wait for the next input data sample from ADC 186.

Otherwise, routine 700 looks at the state of FLAG0 indicating whether the RCVR GATE signal is asserted (decision block 714). If the RCVR GATE signal is not asserted, control returns to decision block 706 to check again for input dam. On the other hand, if the RCVR GATE signal is asserted ("Y" exit to decision block 714), routine 700 performs a GET DATA operation (block 716) in order to generate a 4-byte number in the data structure format shown in FIG. 7F blocks 1002 and 1004, for example. This data structure may comprise a multi-byte record 1000 which has the current phase index count intPHASE in the first byte 1002, the channel number ("I or Q") in the second byte 1004, and the data set stored in the following bytes 1006. Bytes 1002, 1004 comprise a header for the data set being output in each output channel FIFO, this information being used by the filtering DSPs 350, 450 to execute filtering correctly.

Since the currently received input sample (and, generally, also subsequently received input samples) are going to be demodulated now that the RCVR GATE signal is asserted, routine 700 transfers control to a further routine 725 called DEMOD_LP in the preferred embodiment (block 718). DEMOD_LP (which stands for "demodulate loop") is performed continually while the RCVR GATE signal is asserted (so long as the filter DSPs 350, 450 continue to want data) in order to actively demodulate each incoming input sample from ADC 186. The DEMOD_LP routine 725 implicitly maintains the phase index by stepping through four demodulator stages (a 0° stage, a 90° stage, a 180° stage, and a 270° stage), advancing from one stage to the next sequential stage in response to receipt of each "next" data input sample from ADC 186. Block 718 shown in FIG. 7(A) checks the current value of the phase index counter intPHASE, and transfers control to the appropriate one of the four stages of DEMOD_LP routine 725. Thus, routine 700 will transfer control to the "0° stage if intPHASE=0, to the 90° stage" if intPHASE=1, to the 180° stage if intPHASE=2 and to the 270° stage if intPHASE=3.

Figure 7B:
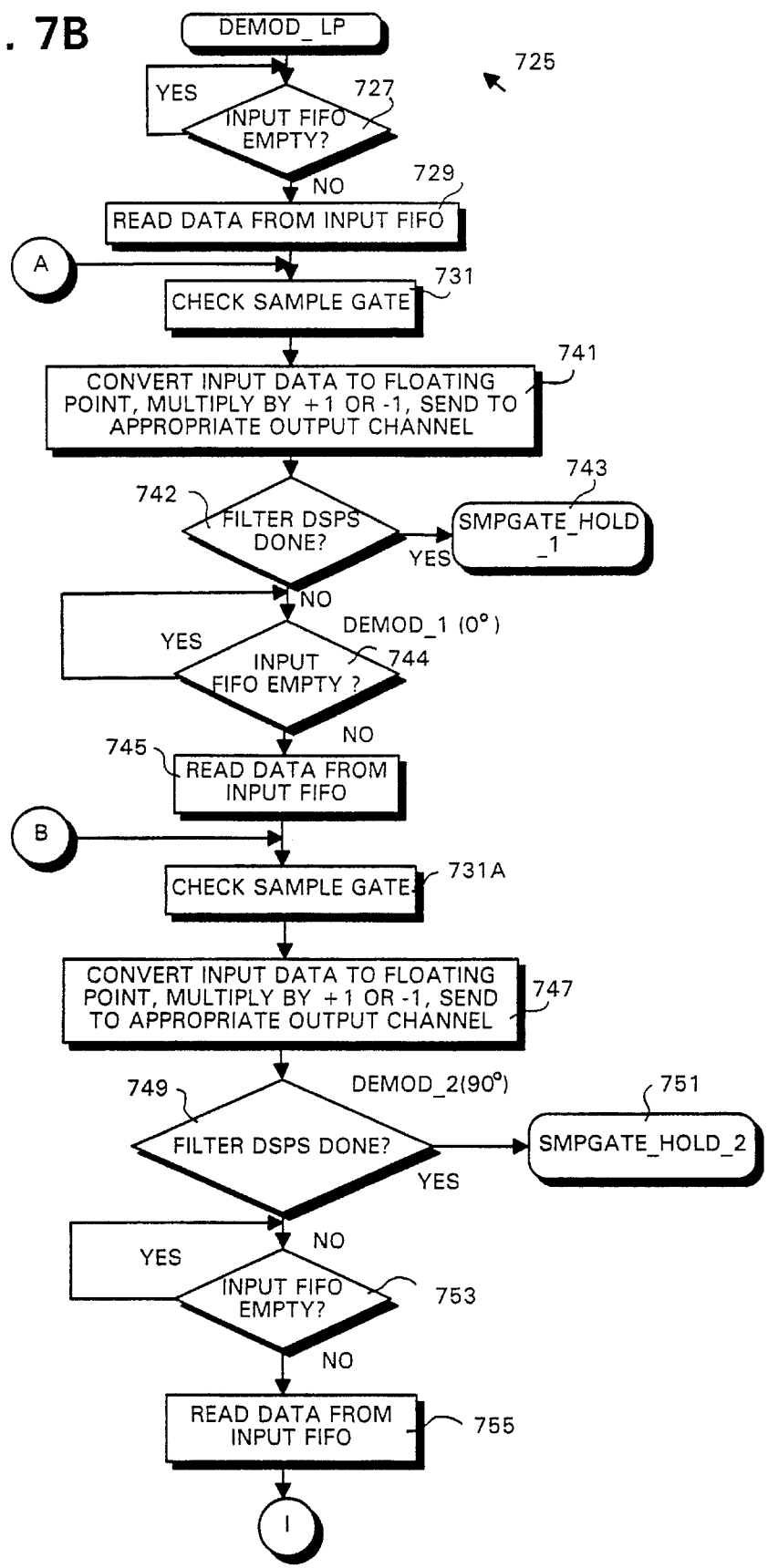
Figure 7C:
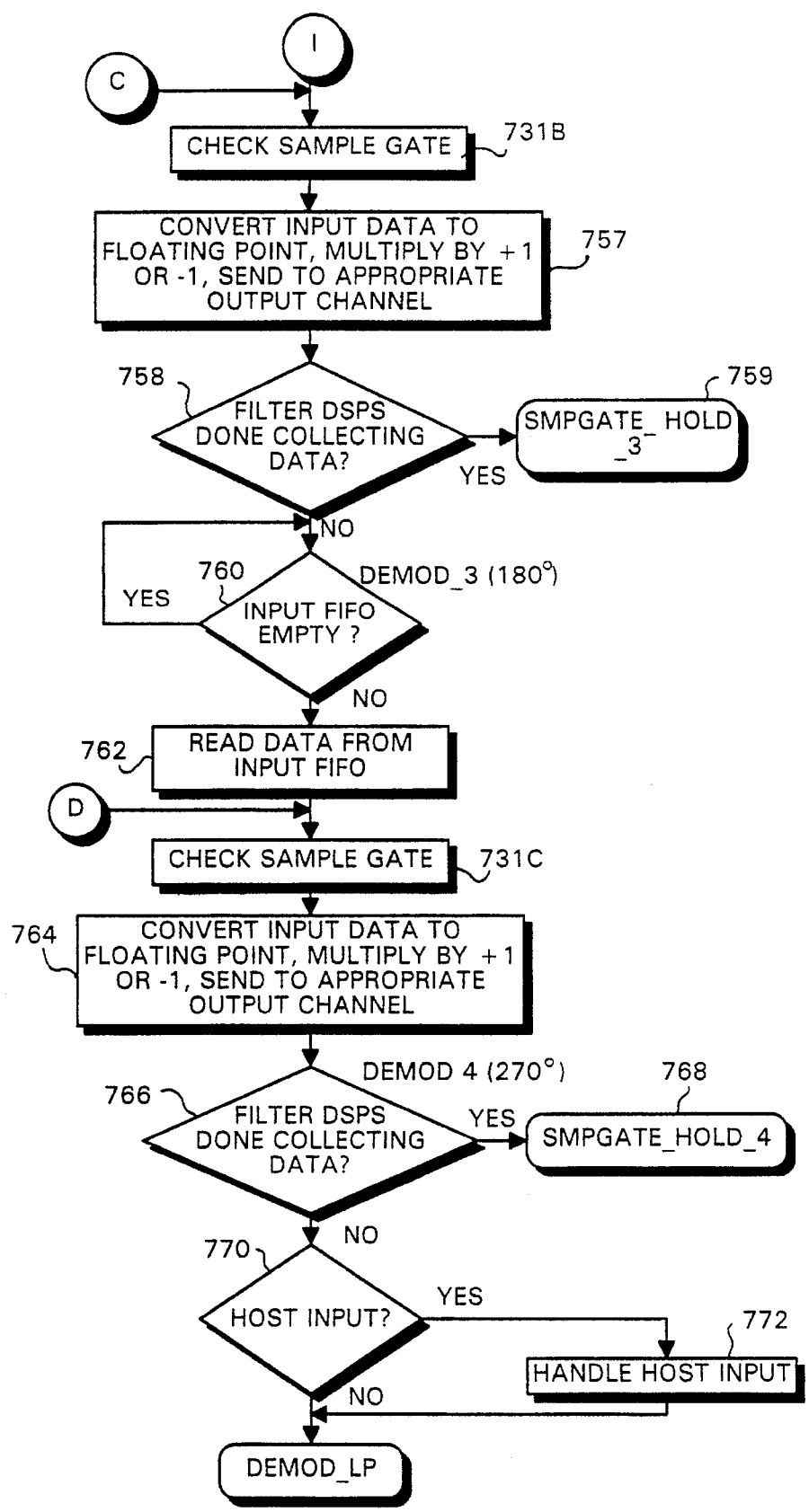

The DEMOD_LP routine of the preferred embodiment is shown in FIGS. 7B–7C. As mentioned above, this routine 725 has several entry points ("A", "B", "C", "D") from the START_DEMOD routine 700, but generally once it is entered it executes as a long loop to step through each of four demodulation stages. Block 727 (which is the "beginning" of the loop in the preferred embodiment) checks for data input from the input FIFO. When an input sample is received from ADC 186, block 729 reads the input data from the input FIFO.

Routine 725 next checks the state of SAMPLE GATE (block 731) (note that the "A" entry point from the START_DEMOD routine 700 is just prior to block 731). Block 731 determines whether the SAMPLE GATE signal is asserted, and also maintains a SAMPLE GATE flag intSMPGT. FIG. 7E is a more detailed flowchart of block 731. A decision block 733 determines whether the SAMPLE GATE signal is asserted by checking an associated DSP flag FLAG1. If SAMPLE GATE is asserted, decision block 735 checks the SAMPLE GATE flag variable intSMPGT to determine whether it is set. If the flag is not set, then block 737 sets the flag and may also do further housekeeping (e.g., set a status bit SGDEMOD in the DSP 250 internal status register). If, on the other hand, decision block 733 determines that the SAMPLE GATE is not asserted, decision block 739 checks whether the SAMPLE GATE flag variable intSMPGT is set. If the flag is set, block 739 resets the flag (and may also clear the SGDEMOD status bit).

Figure 7D:
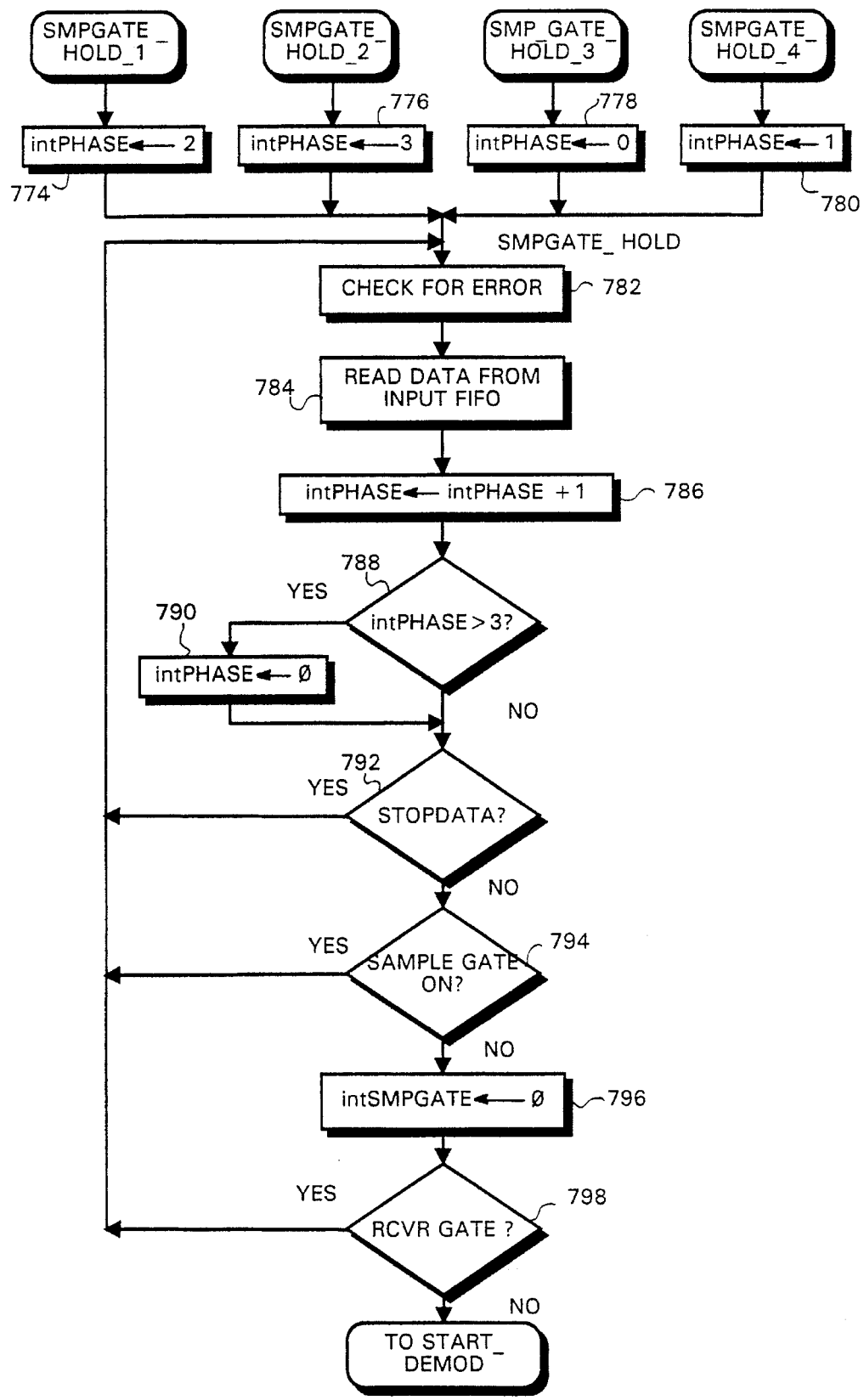
Figure 7E:
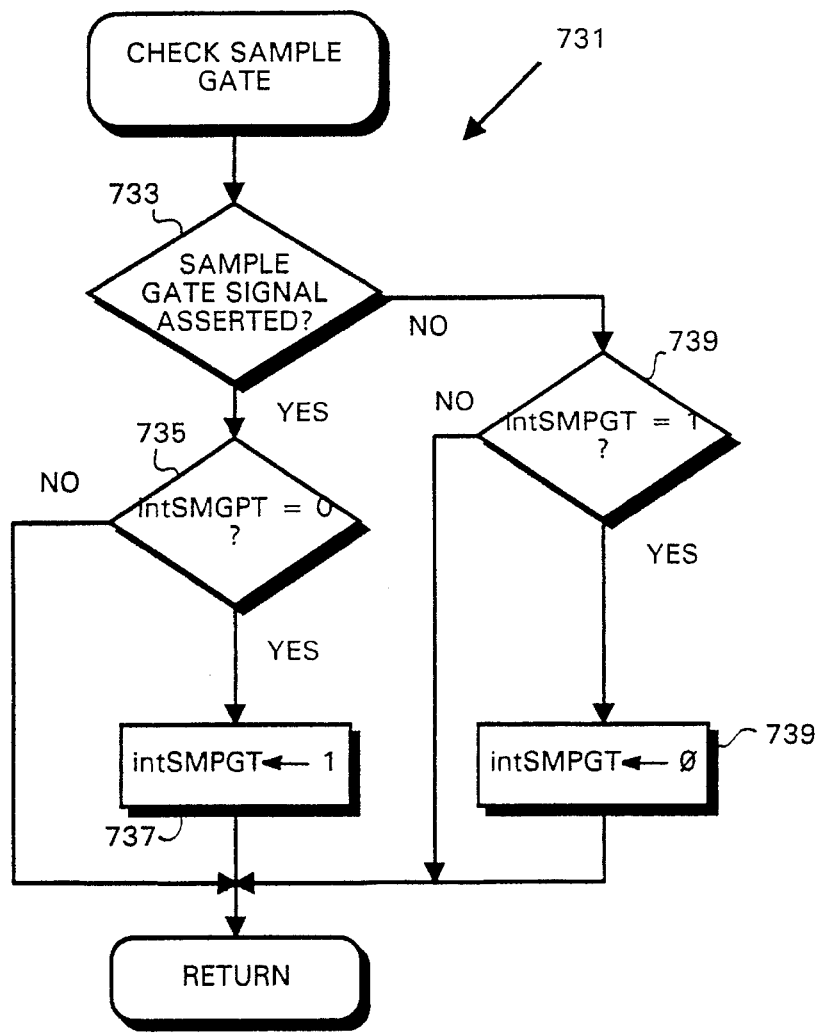
Figure 7F:
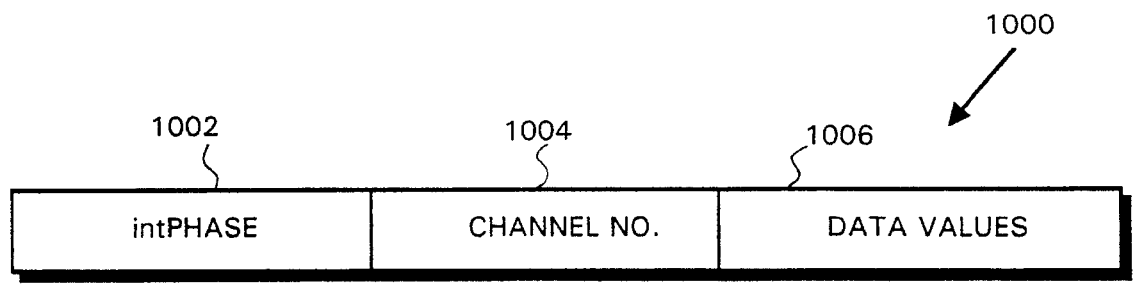
FIG. 7F is a schematic diagram of an exemplary data structure format used by the program control steps shown in FIGS. 7A–7E.

Referring again to FIG. 7B, the received input sample from ADC 186 is converted to 32-bit floating point format in the preferred embodiment, is multiplied by +1 or −1 as appropriate, and is sent to the appropriate output channel in the format shown in FIG. 7F, for example (block 741). Routine 725 then checks the STOP_DATA flag to determine whether DSPS 350, 450 have signalled that they have enough data (block 742). If DSPs 350, 450 issue STOP_DATA, routine 725 exits to the FIG. 7D routine via entry point SMPGATE_HOLD_1 (bubble 743). Otherwise, DEMOD_LP routine 725 waits for the next input sample to arrive from ADC 186 (decision block 744).

When the next sample arrives, it is read (block 745) and the state of SAMPLE GATE is again checked by performing the steps shown in FIG. 7E (block 731A) (note that the "B" entry point from FIG. 7A occurs just prior to block 731A).

The received input sample is then converted to 32-bit floating point format, is multiplied by +1 or −1 as appripriate, and is sent to the appropriate output channel (block 747). In the preferred embodiment, the DEMOD_ROUTINE 725 next checks to determine whether the filter DSPs 350, 450 are done collecting data by testing the STOP_DATA flag (decision block 749).

If this STOP_DATA flag is asserted, control is transferred to the routine shown in FIG. 7D at the entry point SMP-GATE_HOLD_2 (bubble 751). Otherwise, DEMOD_ROUTINE 725 again waits for the next input sample from ADC 186 (decision block 753), and reads the data from the input FIFO once it arrives (block 755). DEMOD_ROUTINE 725 again checks the state of SAMPLE GATE (block 731B) using the steps shown in FIG. 7E (note that the "C" entry point from the START_DEMOD routine 700 is just prior to block 731B). DEMOD_LP routine 725 converts the received input sample to floating point format, and sends the resulting data value to the appropriate output channel (block 757). Decision block 758 checks whether DSPs 350, 450 have signalled that they are finished collecting data, and if they are, routine 725 exits to the FIG. 7D routine via entry point SMPGATE_HOLD_3 (block 759). Otherwise, DEMOD_LP routine 725 again waits for the next sample from ADC 186 (block 760), and reads it when it arrives (block 762). Routine 725 again checks the state of SAMPLE GATE (block 731C; note that the "D" entry point from START_DEMOD routine 700 occurs just prior to the block 731C). DEMOD_LP routine 725 converts this most recently received sample to floating point format and sends it on to the appropriate output channel (block 764). The DEMOD_LP routine 725 may at this point check for error conditions in the status register and jump to an error handling routine (not shown) if an error has occurred. DEMOD_LP routine 725 at this point checks whether the filter DSPs are done collecting data (block 766) (e.g., by looking at the STOP_DATA flag). If the filter DSPs are done collecting data at this point, DEMOD_LP routine 725 transfers control to the routine shown in FIG. 7D using an entry point SMPGATE_HOLD_4 (bubble 768). Otherwise, DEMOD_LP routine 725 checks to determine whether the host computer has provided any input to the demodulator DSP 250 (e.g., by looking at a bit in the DSP status register (decision block 770)). If the host has provided input, the routine may handle that input (block 772). In any event, control returns to the beginning of the DEMOD_LP routine 725 (i.e., to block 727) to wait for the next input from ADC 186.

FIG. 7D is a flowchart of steps performed by DSP 250 when the filter DSPs 350, 450 have signalled to the demodulator DSP 250 that it should stop collecting data. As mentioned previously, there may be four entry points to the routine shown in FIG. 7D. Which entry point is used depends upon the stage of DEMOD_LP from which the FIG. 7D routine is entered. These various entry points ensure that the SAMPLE GATE phase variable intPHASE is set to the appropriate value (0, 1, 2, 3) depending upon which demodulator stage was being performed at the time the filter DSPs asserted STOP_DATA (blocks 774, 776, 778, 780). DSP 250 then enters a loop which continually increments the phase index count intPHASE until the RCVR GATE signal is deasserted. More specifically, DSP 250 next checks for an error (e.g., by looking in its status register) (block 782) and may perform an error handling function (not shown) if an error is detected. DSP 250 next reads data from its input FIFO (block 784), and increments the phase index count intPHASE by adding 1 to it (block 786). DSP 250 next determines whether the incremented intPHASE value exceeds 3, and if it does, it resets intPHASE to 0 (decision blocks 788, block 790). DSP 250 next determines whether the STOP_DATA flag is still on, and loops back to block 782 if it is (decision block 792). If the STOP_DATA flag has been deasserted, DSP 250 checks whether the SAMPLE GATE signal is still on (decision block 794). If SAMPLE GATE is on, control continues to loop back to block 782. Otherwise, DSP 250 resets the SAMPLE GATE flag intSMPGATE to 0 (block 796), and determines whether the RCVR GATE signal is still asserted (decision block 798). If RCVR GATE is still active, program control loops back to block 782. When RCVR GATE is deasserted, control loops back to the beginning of the START_DEMOD routine 700 shown in FIG. 7A.

Synchronized Digital Filtering

Figure 9:
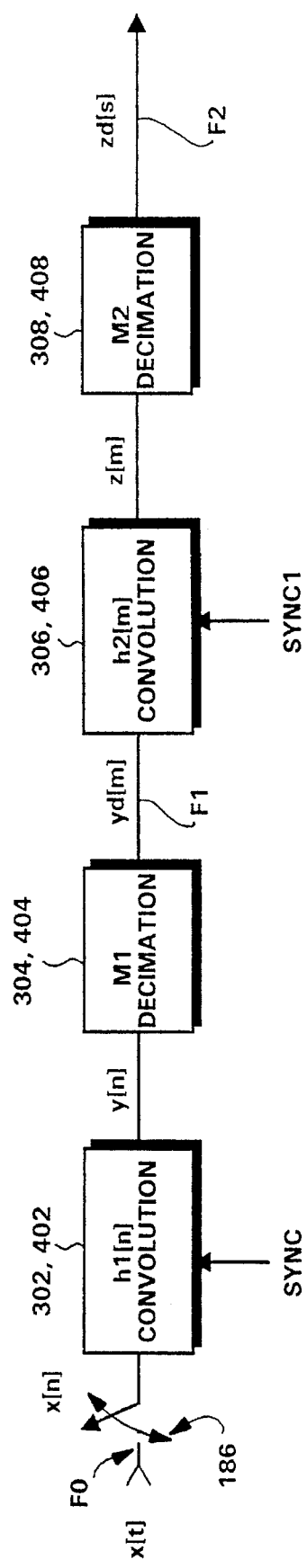
FIG. 9 is a block diagram showing the overall digital processing steps performed by the digital receiver of FIGS. 3A–3B.

FIG. 9 is a block diagram representation of the filtering processes performed by each of digital filtering blocks 300, 400 in the preferred embodiment. The model of the preferred embodiment multi-rate FIR filter digital system shown in FIG. 9 begins with sampling the analog input signal x[t] at a 500 KHz oversampled rate to produce sampled data stream x[n]. In the preferred embodiment, the sampling is performed by ADC 186 at rate F0. In the preferred digital receiver 150, the ADC 186 samples the signal with a bandwidth greater than that of the filtered signal. This means that the sample rate of the input (x[ ]) is higher than is needed to support the bandwidth of the output (zd[ ]). The sampling rate of the input can be reduced by decimation to provide only enough samples to support the output over its actual bandwidth. In general, the rate can be modified by multiplication by the ratio of integers, K/M. K is an interpolation factor that increases the sample rate and M is a decimation factor that reduces the sample rate. This provides great flexibility in the choice of output sample rate. For most MRI applications, slight constraints on bandwidth allow us to simply decimate the data set. A 1/M factor of sample rate reduction provides finely enough spaced values of sample rate.

Although FIG. 9 does not show the quadrature detection process, x[n] is next subjected to quadrature detection (as described above) to provide a quadrature modulated base band signal (either in-phase or quadrature). In the preferred embodiment blocks 302, 304, 306 & 308 are performed for the I channel by one DSP 350, while identical processing blocks 402, 404, 406 & 408 are performed by another DSP 450 for the Q channel.

The sampled data set x[n] is first processed using a standard convolution transformation (block 302, 402) to provide a resulting data set y[n] resulting from x[n] convolved with h1[n]. The array of filter coefficients h1[n] implements the first FIR filter stage. Each y[n] is computed when sufficient x[n] have been received. In the preferred embodiment, the convolved data set y[n] is then decimated by block 304, 404 to provide a data set yd[m] resulting from decimation of y[n] by $M_1$. This data set yd[m] at rate F1 is the output of the first FIR digital filter stage (see FIG. 8). Note that the array index "m" of this decimated output is at a different (lower) rate F1 than the sampling rate F0 of the input data set x[n].

The decimated set yd[m] is then convolved by further inverted convolution block 306, 406 to provide a data set z[m] resulting from yd[m] convolved with h2[m]. Partial sums of products are computed as each yd[m] becomes available. This resulting convolved data set z[m] is decimated by a second decimation block 308, 408 to provide an output data set zd[s] resulting from the decimation of z[m]

by decimation function M2. This output data set zd[s] at rate F2 is the output of the second digital filter stage (see FIG. 8). Note that the rate F2 of this decimated output is at a different (lower) rate than that of the first filter output yd[m].

This multi-rate FIR filtering using two cascaded digital filter stages (blocks 302, 304 providing the first filter, blocks 306, 308 providing the second) provides certain advantages. In particular, oversampling of the input data at rate F0 followed by a first convolution and decimation to provide a first output yd[m] at rate F1, F1<F0, followed by a second convolution and associated decimation to provide a second output zd[s] at rate F2, F2<F1, provides an implementation with significantly reduced overall computation, reduced storage, simplified filter design (i.e., wider normalized transition bands allowed at the first filter stage) and reduced finite-word-length effects (round off noise and coefficient sensitivity). See, for example, Chapter 5 entitled "Multistage Implementations of Sampling Rate Conversion" beginning at page 193 of Crochiere et al, *Multirate Digital Signal Processing* (Prentice-Hall 1983). Because of the multistage design shown in FIG. 9, the first convolution filtering stage 302, 402 operates with a relatively large sampling rate and associated large transition width, thereby leading to relatively smaller required filter length (i.e., number of taps). For the second convolution stage 306, 406, the transition width becomes small in the preferred embodiment, but so does the decimation factor and the combination again leads to relatively smaller values of required filter length. In the preferred embodiment, for example, the first convolution 302, 402 has on the order of 200–512 taps, and the second convolution 306, 406 has on the order of 128 taps. The computation is kept low in each stage of the overall multistage structure—leading to substantially reduced computational complexities compared to a single-stage digital filter. The current reduction to practice of the preferred embodiment uses two filter stages but more are equally possible.

Figure 10:
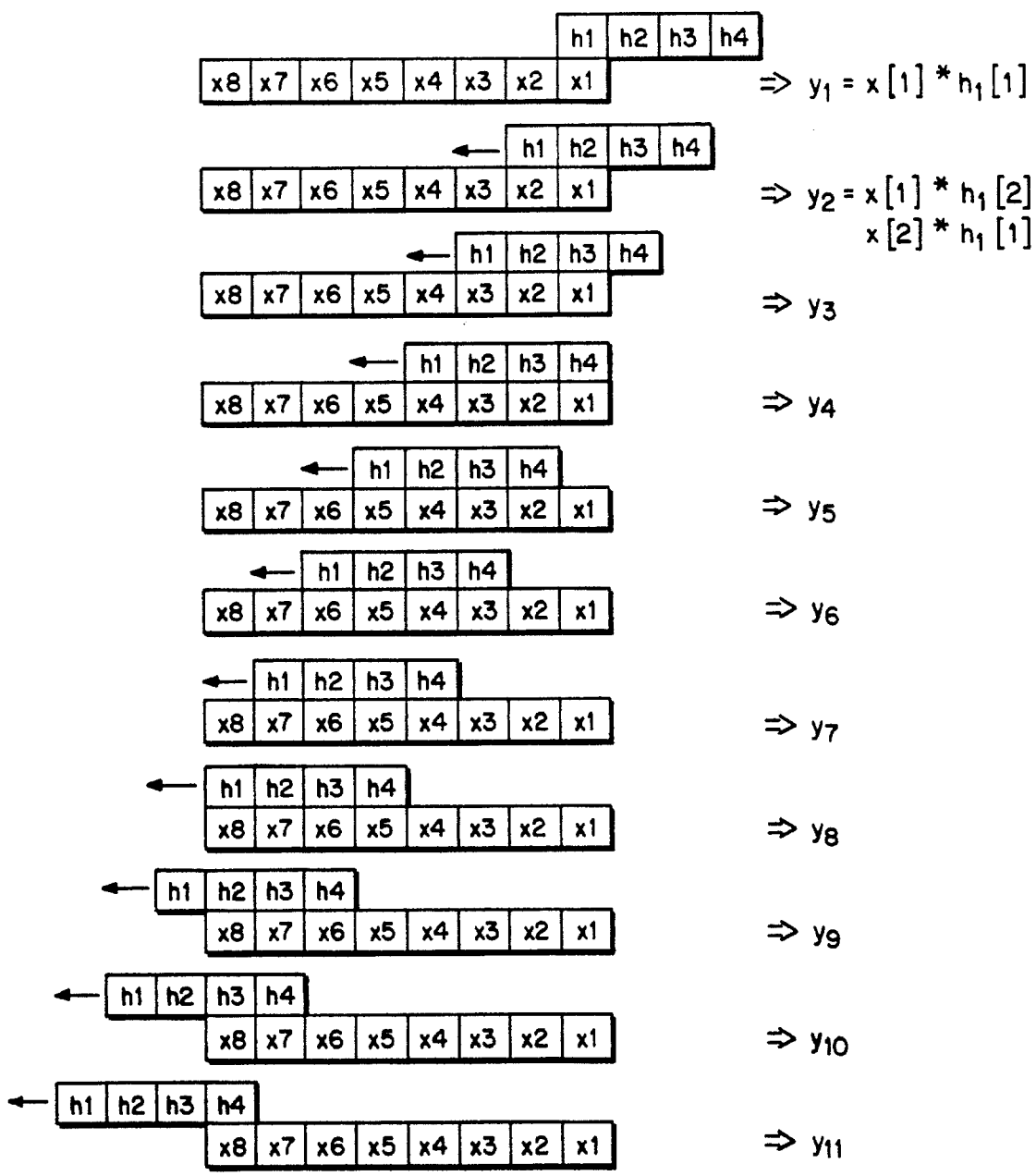
FIG. 10 is a schematic illustration of the convolution operation performed by the preferred embodiment.

An FIR filter of the type shown in blocks 302, 402 & 306, 406 performs direct convolution of an impulse response h[ ] with the input data stream x[ ]. For a data set sampled with a rectangular time window (defined by RCVR GATE in the preferred embodiment and further defined by synchronization with SAMPLE GATE), the input data stream x[ ] has a limited length—and the question arises regarding what is convolved with h1[ ] for the calculation ranges where h1[ ] overlaps only part of the input stream x[ ]. FIG. 10 shows what is meant by the various "overlaps" (for example, h1[ ] and x[ ]) while also illustrating the overall convolution process performed in the preferred embodiment. FIG. 10 is a simplified example showing four FIR filter coefficients or "taps" (h1, h2, h3, h4) that are to be convolved with an input data set x[ ] comprising eight elements x1–x8. As shown in FIG. 10, the convolution process can be understood as a process of "sliding" the filter taps relative to the input data set, and calculating a sum of products for each different "slided position" of the filter taps (h1, h2, h3, h4) relative to the data set.

FIG. 10 shows the filter taps "sliding" from right to left relative to the input data set x1–x8, and shows each of the eleven unique meaningful "positions" of filter taps versus input data set for the particular configuration given by example. As can be seen in the first and last three examples shown in FIG. 10, some of the h values have no corresponding non-zero x—and therefore do not contribute to the output value y[ ] for that particular "slided position." This is because all inputs x[n], n<0, are defined to be zero in the preferred embodiment. Similarly, since no taps "line up" with input values for relative positions between filter taps and input values other than those shown in FIG. 10 due to the finite length of the input data set shown, those other relative positions contribute only zero values to the filter output and accordingly are not shown.

A sum-of-products is calculated for each of the eleven unique "positions"—providing eleven output values y1—y11. At the relative "slided position" of the filter taps relative to the data set x[ ] shown at the top of FIG. 10, the first filter tap h1 is "aligned" with data set element x1 to produce a product x[1]*h1[1]. Since all other filter taps (h2, h3, h4) are "aligned" with 0 input data set values, these do not contribute to the results and the sum of products for this y1 is simply:

$$y1=x[1]*h1[1].$$

The next filter output point y2 is calculated by "sliding" the filter taps h1–h4 one position to the left relative to the input data set x[ ], and calculating the resulting sum of the products defined by filter taps "aligned" with data set values x. This yields the following results for data output points y2:

$$y2=x[1]*h1[2]+x[2]*h1[1].$$

This process continues for each different position of the FIR filter taps relative to non-zero values of the input data set to yield eleven different sum-of-product output values for the digital filter.

Since the actual input stream x[ ] in the preferred embodiment is defined by the RCVR GATE window, it too has a finite known length. Similarly, although the number of filter taps in the preferred embodiment is on the order of several hundred and is therefore much greater than the four taps shown in FIG. 10, the "sliding" process illustrated in the FIGURE (which the DSPs 350, 450 perform by manipulating memory pointers in the preferred embodiment) is directly analogous to what occurs in the convolution of x[ ] with h1[ ] in the preferred embodiment of the first FIR filter stage.

Decimation can be straightforwardly performed for an FIR filter by simply computing only selected ones of the output values generated by the convolution. For example, if one wishes to decimate by a factor of M=2, it is possible to simply compute every other convolution output point (e.g., y0, y2, y4, y6, . . . ) and ignore the other output points. This has the desired effect of reducing the rate of the convolution output by the desired factor, but assumes that the bandwidth of x[ ] has been reduced so that the Nyquist criterion is not violated.

The following is a somewhat more rigorous description of the synchronized convolution/decimation digital filtering process performed by the preferred embodiment.

As shown in FIG. 9, x[0] occurs immediately after digital receiver 150 is enabled for output by RCVR GATE. "sync" is the index of the x[ ] element after the SAMPLE GATE input signal occurs, and "sync1" is the synchronization index for yd[m]. The time during which data is collected into x[n] is sufficient in the preferred embodiment that typically less than 512 zd[s] data points can be calculated. The synchronized output of the multirate system correlated with sync goes into zd[0]. The signal y[n] is:

$$y[n] = \sum_{k=0}^{N1} h1[N1-k] * x[n-(N1-k)] \quad (1)$$

where N1=(order of h1)–1—that is, the number of filter coefficients or taps of block 302, 402 minus 1. The order of h1 and h2 are even numbers in the preferred embodiment.

The filter output yd[m] which is synchronized with the leading edge of SAMPLE GATE is yd[sync1], where sync1= sync/M1, which are integers. Then yd[0]=y [A], where A=sync-(sync1*M1). In general:

If "NUM_PTS" is the total number of points x[n] collected, then the last yd[m] occurs when $$yd[m] = y[(A + m*M1)] \quad (2)$$
$$= \sum_{k=0}^{N1} h1[N1 - k] * x[(A + m*M1) - (N1 - k)]$$

$$A + (m*M1) = NUM\_PTS \quad (3a)$$
$$m = (NUM\_PTS - A)/M1 \quad (3b)$$

Equation (2) is the exact synchronized output of the first filter stage as used in the preferred embodiment of the invention.

The output of second FIR stage h2 is:

$$z[m] = \sum_{k=0}^{N2} h2[N2 - k] * yd[m - (N2 - k)] \quad (4)$$

when computed using a standard convolution where N2=(order of h2)−1. It is necessary to start the convolution of h2 with the yd[sync1] signal element delayed by the group delay of h2( (order of h2)/2). This minimizes the transient output. So the first output zd[0] corresponds to z[(N/2)+sync1] where N=(order of h2):

$$zd[0] = z[(N/2) + sync1] \quad (5)$$
$$= \sum_{k=0}^{N2} h2[N2 - K] * yd[sync1 - ((N2 - 1)/2) + k]$$

In general, the decimated output of M2 is:

$$zd[s] = z[(N/2) + sync1 + (s*M2)] \quad (6)$$
$$= \sum_{k=0}^{N2} h2[N2 - k] * yd[sync1 + (s \times M2) - ((N2 - 1)/2) + k]$$

$\forall s \in [0, NUM\_OUT]$, where NUM_OUT is the specified number of output points for the MRI acquisition.

It is easier not to use the limit on the summation of each zd[s] to be N2 but rather to use N−1. This eliminates possible inaccuracy in understanding the computation of the indices of yd[n]. So the output zd[s] becomes:

$$zd[s] = \sum_{k=0}^{N-1} h2[(N - 1) - k] * \quad (6a)$$
$$yd\left[sync1 + (s*M2) - \frac{N}{2} + 1 + k\right]$$

where N is the order of h2 and M2 is the decimation factor following h2.

The preferred embodiment implements these synchronized equations to process x[n] into yd[m] directly with a standard convolution, and then from yd[m] to zd[s] directly with an inverted convolution, since h1 and h2 are FIR filters and only the desired outputs must be computed. An FIR filter makes this possible because it uses only inputs to compute future outputs (unlike an IIR filter that uses inputs and prior outputs to compute new outputs).

Decimation is easily done on low pass filtered dam by just taking every Mth y[n] out of the set of y[ ]. The most efficient way to perform decimation is to use an FIR filter that performs direct convolution but only computes the outputs needed for the decimation. Such a computation does not calculate M−1 unused output values for every one that is used. With this technique, decimation by M provides a factor of M reduction in necessary calculations in the preferred embodiment.

Additional improvement is possible when the input is zero-padded or certain inputs are not used. The code executed by digital filter DSPs 350, 450 can be structured to skip the multiply/accumulate operations if x[ ] is 0 over some range, as before RCVR GATE is asserted. Thus, for example, a first pass through the digital filtering code below (i=j=1, where i, j are loop counters) starts the convolution with x[M+1−ORDER] which is 0. The x[ ] values continue to be 0 until j=ORDER+1−2M, at which point the preferred embodiment begins computing with actual inputs. In this pass, the preferred embodiment program skips these ORDER+1−M multiply/accumulate operations. In the next pass through the outer loop, the inner loop can skip ORDER+1−2M multiply/accumulate operations. This pattern continues for 3M, 4M . . . until nM≧ORDER. At that point, the convolution no longer overlaps data prior to x[1]. The number of skipped multiply/accumulate operations depends on both M and ORDER in a somewhat complex fashion. An example gives an idea of the improvement assuming ORDER<NUMPTS. For M=10 and ORDER=75, the program can skip the following calculations of the first seven passes:

| Pass | Number of calculations skipped |
|---|---|
| 1 | ORDER + 1 − M = 66 |
| 2 | ORDER + 1 − 2M = 56 |
| 3 | ORDER + 1 − 3M = 46 |
| 4 | ORDER + 1 − 4M = 36 |

(6)

-continued

| Pass | Number of calculations skipped |
|---|---|
| 5 | ORDER + 1 − 5M = 26 |
| 6 | ORDER + 1 − 6M = 16 |
| 7 | ORDER + 1 − 7M = 6 |

Total number of calculations skipped is 252.

The following example of code for controlling the operation of digital filter DSPs 350, 450 implements FIR lowpass filtering and decimation of the input x[ ] while providing a reduced number of calculations by using the optimizations discussed above. The decimation ratio is M, the filter impulse response is h1[ ], ORDER is the number of coefficients in the impulse response, NUMPTS is the number of elements in the input x[ ], P is NUMPTS/M, and the output is y[ ]. x[ ] has more elements than h1[ ], i.e., NUMPTS>ORDER.

EXAMPLE:

```
for(i = 1:P)
    y[i] = 0
    end
for(K = 1:P)
    j = (ORDER/2) + 1 + (K − 1) * M
    if(j < ORDER + 2)
        for(i = 1:j-1)
            y[K] = y[K] + (x[i] * h1[j − i])
            end
    else if (j < NUMPTS + 2)
        for(i = j-ORDER:j-1)
```

-continued

```
        y[K] = y[K] + (x[i] * h1[j – i])
      end
  else if(j < NUMPTS + ORDER + 1)
      for(i = j-ORDER:NUMPTS)
        y[K] = y[K] + (x[i] * h1[j – i])
      end
end
```

FILTER LATENCY

The techniques described above (e.g., only calculating convolution outputs that will be meaningful to the overall filtering process output) can be used to provide decreased overall filtering time. However, the fact that the two filters are cascaded (one follows the other in series) introduces a potentially serious latency problem. The standard approach for computing FIR filters is to do it serially. All of the data points from the input stream are collected for a standard convolution and then an FIR filter output is computed. Once enough outputs of the first FIR filter are computed to allow a second standard convolution, then a second filter stage output is computed. As more outputs from the first filter stage are computed, more outputs from the second stage are computed using standard convolutions. Thus, many yd[m] and zd[s] cannot be computed without waiting for more x[n] to be collected by ADC 186. This means that there can be a significant lag in the generation of final filter outputs once the last valid input data has been input to the multi-rate FIR filter. This can be a problem in MRI systems, since data must be processed in real time.

As discussed in detail above, in the preferred embodiment data acquisition begins at a specific point in time with respect to the control outputs of the MRI microcoded control sequencer 52. In the preferred embodiment, sequencer 52 produces an output signal RCVR GATE which opens a "window" in time during which outputs of ADC 186 must be digitally filtered. This means that the "sync" index of the data input stream must be maintained. This sync index points to the first x[ ] value acquired after the synchronizing signal SAMPLE GATE. In the multi-rate sampled data system, the sync index depends on the sample rate F0 and the delay between the assertion of RCVR GATE and SAMPLE GATE. By keeping the synchronization of the input data x[n] intact, the output of the multi-rate sampling system is always in the same time relationship to the SAMPLE GATE synchronizing signal, and all data sets are thus time coherent in the preferred embodiment.

Referring again to FIG. 8, it can be seen that under some operating conditions there may be only 1 millisecond between the end of the active input data window defined by SAMPLE GATE, and the next RCVR GATE active transition indicating a new input acquisition cycle. However, the first digital filter cannot finish producing its filter outputs until the SAMPLE GATE window is closed—meaning that in somewhat less than 1 millisecond, the second digital filter stage receives the last valid output from the first FIR filter stage, completes its second filter stage convolution calculation, and outputs its filter results to computer 50. Assuming SAMPLE GATE could become active at the same time as RCVR GATE, if the second filter isn't finished processing by the time RCVR GATE becomes active again there is a potential that the second digital filter will be unable to accept new inputs—resulting in a disastrous loss of data and/or inability of the digital demodulator/filter 188 to "keep up" with the real time MRI data acquisition process on an ongoing basis.

In accordance with another aspect of the present invention, it is not necessary to wait until all input data points x[ ] have been collected before second FIR filter computations can be performed. Once the synchronization index into the data stream being input has been identified, it is possible to predict what range of indices will contribute to each output of the second FIR filter stage. This makes it possible to compute the products of the convolution summation for each second stage output as the first filter output data contributing to each computation becomes available. Thus, those yd[m] which have been computed while x[n] are still arriving are used by the preferred embodiment second filter "inverted convolution" as it determines which zd[s] they will be a part of. Those zd[s] of which any given yd[m] will be a part will be partially summed by the second filter from the appropriate products of yd[m] and h2[m] as the yd[m] are computed and become available. This distributes the computation of zd[s] throughout the time that the x[n] are acquired.

We take the case of the second FIR filter 306, 406 in FIG. 9. The equation of the second stage output is as shown in Equation 6a above. Let n be the index into yd[ ] for a convolution product:

$$n = sync1 + (s * M2) - N/2 + 1 + k \tag{7}$$

k=0, 1, 2, . . . , N2
The range of n for a given s is:

$$n \in [sync1 - (N2/2) + (s*M2), sync1 + (N2/2) + (s*M2)] \tag{8}$$

There are two cases of the range n contributing to any given zd[s]. If we assume that sync1<N/2, M2<N/2 where N=the order of h2, n∈[0, YD_LEN−1], s∈[0, NUM_PTS−1] then:

$$\begin{aligned} &\text{if } s \leq \left(\frac{N}{2} - 1 - sync1\right)/M2, \\ &\text{then } n \in \left[0, \frac{N}{2} + (s*M2) + sync1\right]; \\ &\text{if } s > \left(\frac{N}{2} - 1 - sync1\right)/M2, \\ &\text{then } n \in \left[(s*M2) - \frac{N}{2} + 1 + sync1,\right. \\ &\left.(s*M2) + \frac{N}{2} + sync1\right]. \end{aligned} \tag{9}$$

The use of these ranges for index n as a basis for an algorithm for FIR filter convolution computations allows computation of the product terms of all outputs zd[s] as each yd[n] is computed. The preferred embodiment maintains an array of partial sums zd[s]. A subset of this array of partial sums approaches the final output values over the duration of the data acquisition. Once the last data input x[n] occurs and the last yd[m] becomes available from the first filter, at most order of h2 (the number of taps of the second digital filter) products must be computed and added to partial sums before all zd[s] are computed completely and are ready to be output.

In order to efficiently compute the second FIR filter using what might be referred to as a "rolling basis" calculation of partial sums as described above, the preferred embodiment uses an inverted convolution algorithm. This algorithm determines which products with h2[ ] involving a particular yd[m] are part of the sums forming any particular decimated output zd[s]. In order to do this determination, a test of the lowest and highest index values for s must be found since any given yd[m] will only contribute to a subset of zd[s] for s∈[0,NUM_OUT−1].

As an illustrative example, if the order of h2 is N=10, the decimation factor M2=2 and YD_LEN>N, then a chart can be made to show which zd[s] have products involving a particular yd[n]. The first step in making this chart is to run a "spread sheet" which will compute the index ranges for each s. The following result from a spreadsheet shows the range of indices n for convolution of h2[ ] and yd[n] to give zd[s]:

| s | Low n | High n | (negative n default to 0) |
|---|---|---|---|
| 0 | (0) | 5 | |
| 1 | (0) | 7 | |
| 2 | 0 | 9 | |
| 3 | 2 | 11 | |
| 4 | 4 | 13 | |
| 5 | 6 | 15 | |
| 6 | 8 | 17 | |
| 7 | 10 | 19 | |
| 8 | 12 | 21 | |
| 9 | 14 | 23 | |
| 10 | 16 | 25 | |
| 11 | 18 | 27 | |
| 12 | 20 | 29 | |
| 13 | 22 | 31 | |
| 14 | 24 | 33 | |
| 15 | 26 | 35 | |
| 16 | 28 | 37 | |
| 17 | 30 | 39 | |
| 18 | 32 | 41 | |
| 19 | 34 | 43 | |
| 20 | 36 | 45 | |
| 21 | 38 | 47 | |
| 22 | 40 | 49 | |
| 23 | 42 | 51 | |
| 24 | 44 | 53 | |
| 25 | 46 | 55 | |
| 26 | 48 | 57 | |
| 27 | 50 | 59 | |
| 28 | 52 | 61 | |
| 29 | 54 | 63 | |
| 30 | 56 | 65 | |
| 31 | 58 | 67 | |
| 32 | 60 | 69 | |
| 33 | 62 | 71 | |
| . | . | . | |
| . | . | . | |
| . | . | . | |

A chart can be constructed based on the preceding table which shows how the range of n for a given s can be displayed in reverse, e.g., range of s for a given n:

| n | s |
|---|---|
| 0 | 0,1,2 |
| 1 | 0,1,2 |
| 2 | 0,1,2,3 |
| 3 | 0,1,2,3 |
| 4 | 0,1,2,3,4 |
| 5 | 0,1,2,3,4 |
| 6 | 1,2,3,4,5 |
| 7 | 1,2,3,4,5 |
| 8 | 2,3,4,5,6 |
| 9 | 2,3,4,5,6 |
| 10 | 3,4,5,6,7 |
| 11 | 3,4,5,6,7 |
| . | . |
| . | . |
| . | . |

In the general case, starting with the equation 6a for zd [ ] set forth above, where N is the order of h2 and M2 is the second decimation factor, let the index of h2[ ] be:

$$m = (N-1) - k, \quad (10a)$$

and the index of yd[ ] be $$n = \text{sync1} + (s*M2) - \frac{N}{2} + 1 + k \quad (10b)$$

so that $$k = (N-1) - m. \quad (10c)$$

If we combine Equations 10b and 10c, then the index of yd[ ] is:

$$n = \text{sync1} + (s*M2) - \frac{N}{2} + 1 + (N-1) - m \quad (11a)$$

and the index of h2 is:

$$m = \frac{N}{2} + \text{sync1} - n + (s*M2). \quad (11b)$$

Figure 11:
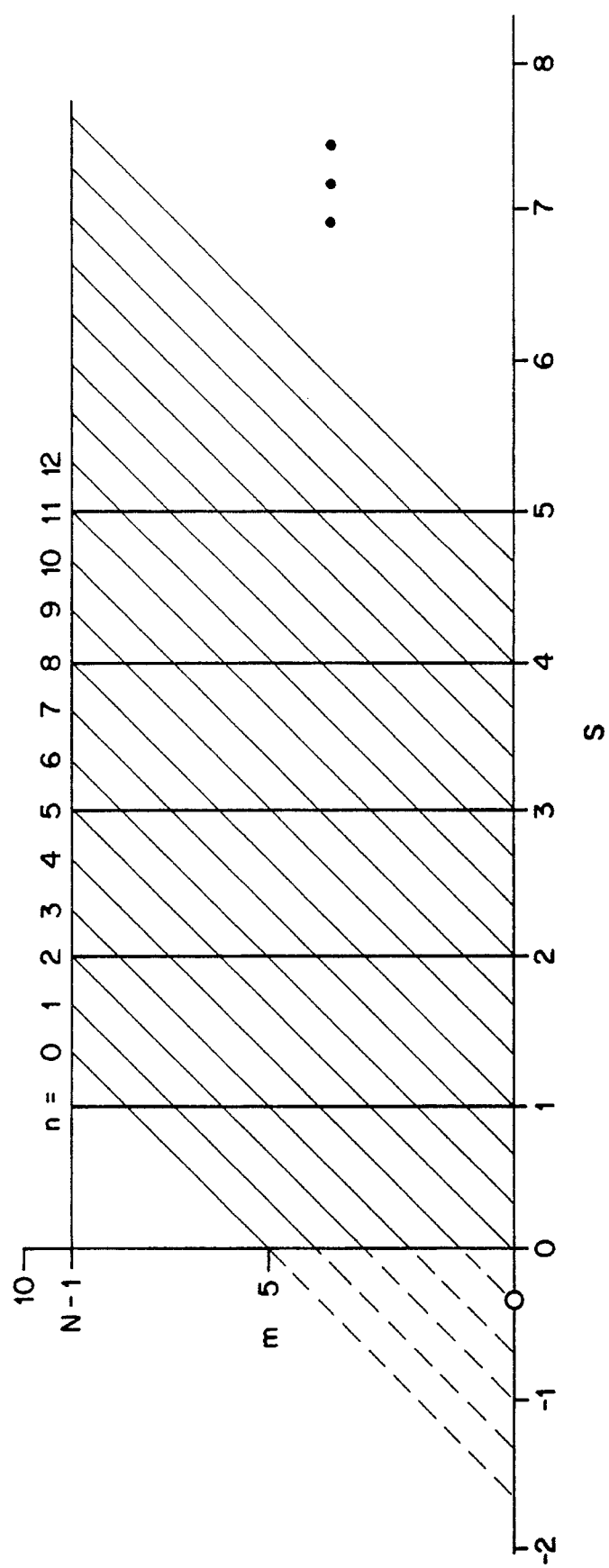
FIG. 11 is a graphical illustration of one example of products that are calculated in the preferred embodiment to provide a digital filter output.

It is possible to graph m versus s for $n \in [0, \text{YD\_LEN}-1]$ in order to get an idea of the relationship of h2[ ] index m to s and n. For the case where N=10, sync1=0, M2=3, an exemplary graph is shown in FIG. 11. Since s is an integer, only the points on the lines of constant n at integer values of s are meaningful. Any point yd[n] is multiplied by h2[m] for a product added to zd[s] if there is an intersection of any integer s on the constant line for n. The m on the vertical axis is the h2 filter index in the product for that s. This means that the integer part of the maximum s for any particular n occurring when m=N−1 is the highest s in which the given yd[n] is used. So if $$N - 1 = \frac{N}{2} + \text{sync1} - n + (s_{done} * M2) \quad (12)$$

then $$s_{done} = \frac{N - 1 - \frac{N}{2} - \text{sync1} + n}{M2} \quad (13)$$

It is possible to express the highest integer s in a computer programming language statement such as the C programming language:

$$s\_done = \left(\left(N - 1 - \frac{N}{2} - \text{sync1} + n\right) - \left(\left(N - 1 - \frac{N}{2} - \text{sync1} + n\right) \% M2\right)\right)/M2:$$

where s_done is the highest index of zd[ ] to which a particular yd[n] contributes.

Clearly, the starting value of s is 0, so negative values of s default to 0. When m=0 we have from Equation 12:

$$0 = \frac{N}{2} + \text{sync1} - n + (s*M2) \quad (14)$$

and $$s = \frac{n - \frac{N}{2} - \text{sync1}}{M2}. \quad (15)$$

This implies that if s starts at 0, then $$n \leq (s_{start} * M2) + \frac{N}{2} + \text{sync1}. \quad (16)$$

In the C programming language, this may be stated as follows:

```
if(n>(s_start*M2)+N/2+sync1))s_start++;
``` where s_start=0 before the inverted convolution begins. Thus Equations 13 and 16 allow full computation of the ranges of s and m for each n.

Figure 12:
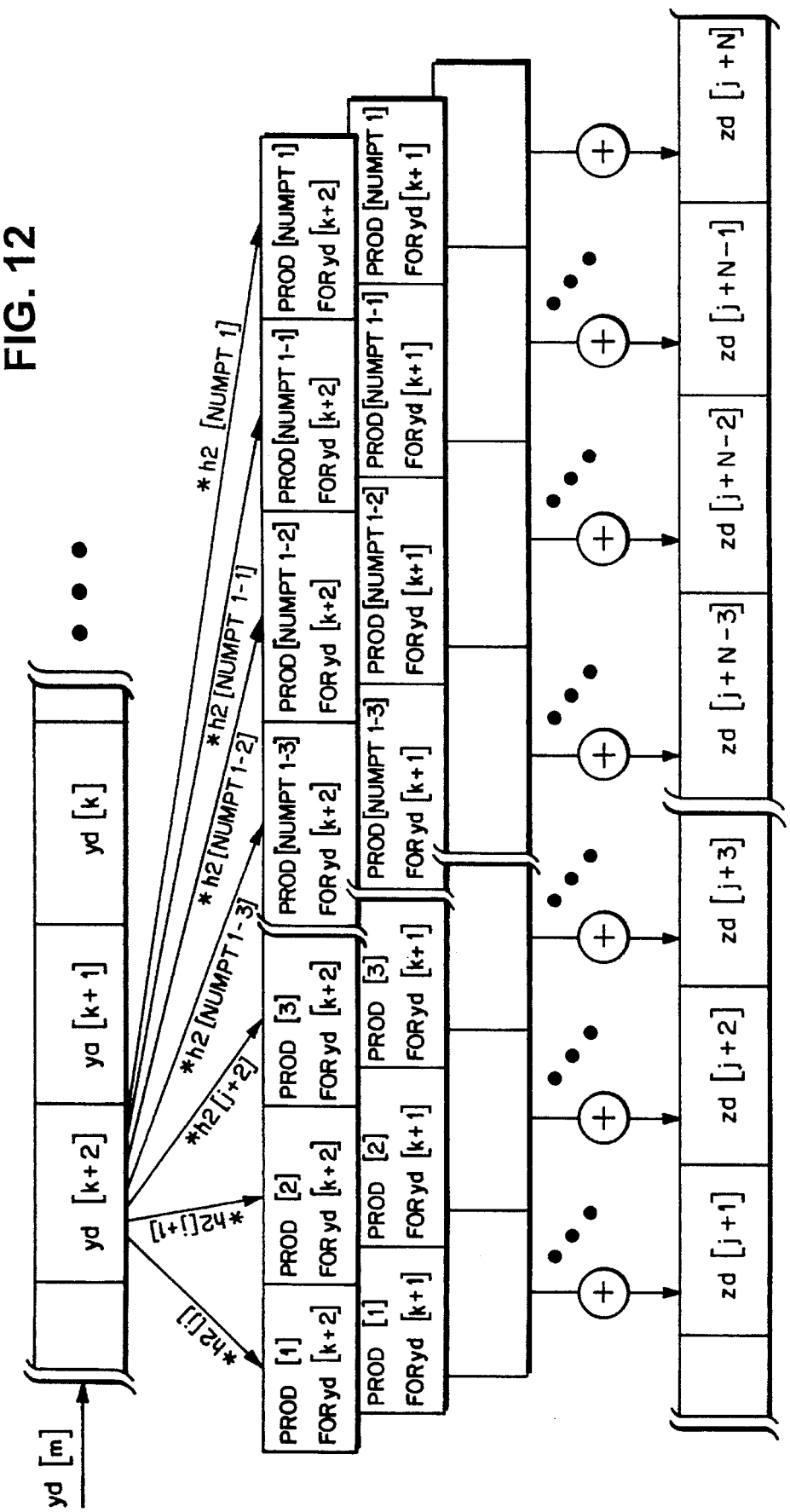
FIG. 12 is a graphical illustration showing calculation of partial sums on an ongoing basis in the preferred embodiment.
Figure 13:
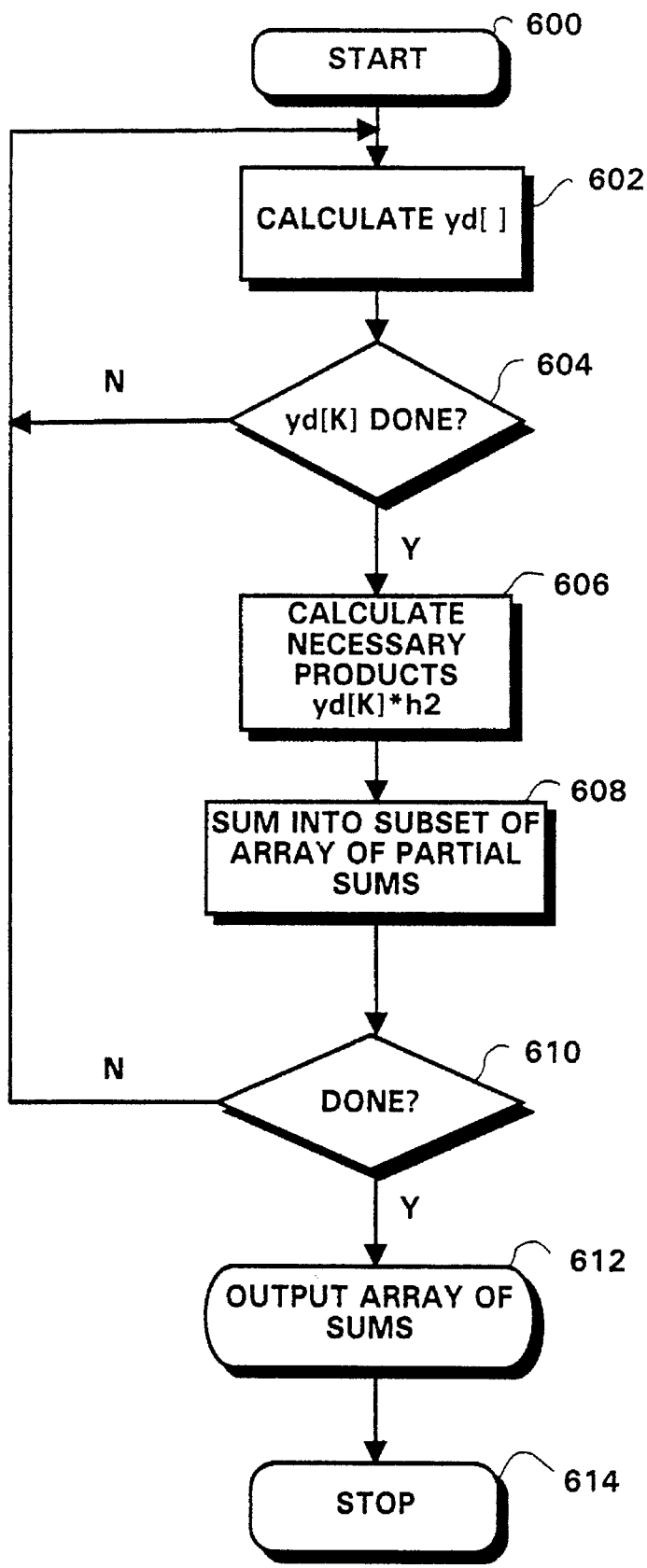
FIG. 13 is a flowchart of exemplary program control steps performed by the preferred embodiment digital signal processors to calculate second filter partial sums on an ongoing basis.

FIG. 12 schematically illustrates the ongoing partial sums calculation described above for the second filtering process, and FIG. 13 schematically illustrates a flowchart of exemplary program control steps performed by DSP 350, 450 in the preferred embodiment to accomplish this ongoing partial sums calculation. The DSPs 350, 450 continually calculate yd[ ] values based on x[ ] input values received from ADC 186 (FIG. 13, block 602). As each next successive yd[ ] value is computed by the first digital filter standard convolution (i.e., no further received x[ ] input values will affect that particular yd[ ] value), the completed value becomes available to the second digital filter stage for calculation (FIG. 13, decision block 604). As shown in FIG. 12, assume that yd[k+2] has just been completed by the first digital filter. At this time, the second digital filter (which in the preferred embodiment is a function performed by the same DSP that performs the first filter function) calculates all products yd[k+2]*h2[j], yd[k+2]*h2[j+1], ... yd[k+2]*h2[NUMPT1] that need to be calculated to produce second digital filter output values zd[ ] (as mentioned above, only those filter output values needed after decimation by M2 will actually be calculated) to produce an array of products PROD[1], PROD[2], ... PROD[NUMPT1] (where NUMPT1 is less than or equal to the length of the second digital filter) (FIG. 13, block 606). These products are then summed into a subset of elements of an array zd[ ] of partial sums (FIG. 13, block 608). This array zd[ ] already contains the sum of all products PROD[1], PROD[2], ..., PROD[NUMPT1] contributed by every one previously available first filter output values yd[0] through yd[k+1] as appropriate based on Equations 13 and 16. This process continues on a real-time basis in the preferred embodiment as each next successive yd[ ] value becomes available. When SAMPLE GATE turns off, the first digital filter receives the last x[ ] and completes its last yd[ ] output value. When this last yd[ ] value becomes available to the second FIR digital filter stage, the second filter need only compute at most the products PROD[1 ], PROD[2], ..., PROD[NUMPT1] contributed by it, and then sum those products into a subset of elements of array zd[ ] to complete that subset of partial sums that are still accumulating in array zd[ ] when SAMPLE GATE is de-asserted. The DSPs 350, 450 may then output the completed array zd[ ] to computer 50 (blocks 610, 612), and await the next RCVR GATE. Alternatively, since some elements of output array zd[ ] are completed long prior to receipt of the final first filter stage output yd[ ] (as described above, it is possible to calculate a range of zd[s] affected by each yd[m], with lower ordered elements in zd[ ] being affected only by lower ordered elements in yd[ ]), if desired, elements of the array zd[ ] may be output to computer 50 on an ongoing basis as they are completed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of digitally receiving nuclear magnetic resonance (NMR) signals emanating from an object undergoing NMR phenomena during a magnetic resonance imaging (MRI) experiment, said method comprising the following steps:

(a) establishing and maintaining, throughout said experiment, a fixed phase relationship between periodic sample timing and said NMR phenomenon;

(b) digitally sampling NMR signals emanated by said object at said sample timing to provide a sequence of discrete digital samples; and (c) generating a phase index throughout said MRI experiment based on said sample timing, said phase index indicating a phase relationship between each of said discrete digital samples and a reference phase.

2. A method as in claim 1 further including digitally filtering said sequence of digital samples based at least in part on said phase index.

3. A method as in claim 1 wherein said generating step (c) includes sequentially changing state each time said step b) samples said NMR signals.

4. A method as in claim 3 further including initially setting the state to a predetermined state.

5. A method as in claim 1 wherein said generating step (c) includes incrementing a counter each time said step (b) samples said NMR signals.

6. A method as in claim 1 further including indexing at least one digital filter input value with said phase index.

7. A method as in claim 1 wherein said generating step (c) includes continually processing said sequence of discrete samples throughout said MRI experiment.

8. A method as in claim 1 wherein said generating step (c) includes continually receiving and processing said sequence of discrete samples with a demodulating digital signal processor throughout said MRI experiment.

9. A method as in claim 1 further including continually starting and stopping a digital filtering operation throughout said MRI experiment.

10. A method as in claim 1 further including stopping and restarting a control sequencer throughout said MRI experiment at a time responsive to said phase index.

11. A method of generating and processing nuclear magnetic resonance (NMR) signals to produce a magnetic resonance image of an object comprising the following steps:

(a) providing a time base;

(b) generating radio frequency pulses having a phase that is synchronized with said time base;

(c) applying said generated radio frequency pulses to said object in a manner that causes said object to emanate an NMR signal;

(d) sampling said emanated NMR signal throughout an MRI experiment at a rate that is synchronous with said time base to provide a sequence of digital samples; and (e) counting said digital samples to provide a phase index relative to each of said samples.

12. A method of generating and processing nuclear magnetic resonance (NMR) signals to produce a magnetic resonance image of an object, said method comprising the following steps:

(a) intermittently exciting said object with an RF signal to produce responsive NMR signals;

b) periodically generating digital samples throughout an MRI experiment at a rate that is phase locked to said RF signal, at least some of said digital samples being responsive to said NMR signals; and (c) tracking the order of said generated digital samples throughout said MRI experiment.

13. A method as in claim 12 further including the step of digitally filtering said generated digital samples including a last digital sample to generate a sequence of filtered digital values, said digitally filtering step comprising:

(1) calculating a partial sum of products prior to said last digital sample becoming available, and (2) completing said sum of products once said last digital sample becomes available.

14. A method as in claim 12 further including calculating partial convolution results before all of said digital samples corresponding to one of said intermittent excitations becomes available, said calculating step including calculating products based on each successive digital sample generated by said step (b) and accumulating said calculated products in partial sums.

15. A magnetic resonance imaging system including:
   a time base producing periodic timing signals;
   a RF transmitter that produces RF signals having a phase responsive to said periodic timing signals, said RF signals at least in part inducing an object to produce NMR signals;
   RF receiver circuitry which receives said NMR signals;
   sampling circuitry for sampling said NMR signal throughout an MRI experiment at timings based on said periodic timing signals to provide a sequence of digital samples; and
   phase index means responsive to said digital samples for allowing the phase of each/any of said digital samples in said sequence to be determined relative to a reference phase.

16. A magnetic resonance imaging system including:
   a time base producing periodic timing signals;
   a RF transmitter that produces RF signals having a phase responsive to said periodic timing signals, said RF signals at least in part inducing an object to produce NMR signals;
   RF receiver circuitry which receives said NMR signals;
   sampling circuitry for sampling said NMR signal throughout an MRI experiment at timings based on said periodic timing signals to provide a sequence of digital samples; and
   a phase index counter which counts said digital samples so as to allow the phase of each/any of said samples to be determined relative to a reference phase.

17. A method of digitally filtering an NMR input signal comprising:
   (a) sampling an input signal to provide a sequence of digital input values;
   (b) filtering said sequence of digital input values to generate a sequence of filtered digital values terminating with a last filtered digital value;
   (c) prior to generating said last filtered digital value with step (b), calculating at least a part of further digital filter results in response to generation of at least some of said filtered digital values generated by said step (b); and
   (d) once said step (b) generates said last digital value, completing said further digital filter results based on said last digital value.

18. A method of timely digitally filtering an NMR signal comprising:
   (a) receiving successive digital NMR signal values over time; and
   (b) digitally filtering said successive digital NMR signal values, including the following steps:
      (1) as each of said successive digital values is received, calculating products based on said received value;
      (2) accumulating said calculated products in partial sums; and
      (3) completing and outputting said sums as a digitally filtered version of said digital NMR signal values when a last of said digital NMR signal values is received.

19. A method of maintaining phase synchronization in a magnetic resonance imaging system comprising:
   (a) periodically sampling a nuclear magnetic resonance (NMR) signal to provide digital samples;
   (b) in an inactive mode, changing the state of a phase index count in response to said samples; and
   (c) in an active mode, quadrature demodulating said samples while tracking the phase of said samples relative to said phase index count.

20. A method as in claim 19 further including the following steps:
   (d) changing from said active mode to said inactive mode; and
   (e) updating said phase index count with said tracked phase at the time said changing step (d) is performed.

21. A method as in claim 19 wherein said step (c) comprises demodulating said samples with plural sequential demodulating stages, and said method further includes terminating said active mode, and updating said phase index count based on which of said plural sequential demodulating stages is being used at the time said active mode is terminated.

22. A magnetic resonance imaging system, comprising:
   a master clock producing a periodic timing signal;
   a RF transmitter producing a RF signal at least in part inducing an object to produce NMR signals;
   an analog mixer, having an input to receive a first signal derived from and in-phase with the periodic timing signal, said analog mixer receiving the NMR signal and translating the NMR signal to an intermediate frequency NMR signal in response to the first signal;
   a digital sampler, having an input to receive a sample signal derived from and in-phase with the periodic timing signal, said sampler producing digital samples of the intermediate frequency NMR signal in response to the sample signal; and
   a phase indexer receiving the digital samples from the digital sampler and determining the phase of a predetermined set of digital samples relative to a reference phase.

* * * * *